(12) United States Patent
Pickett

(10) Patent No.: US 7,867,556 B2
(45) Date of Patent: *Jan. 11, 2011

(54) CONTROLLED PREPARATION OF NANOPARTICLE MATERIALS

(75) Inventor: Nigel Pickett, East Croyden (GB)

(73) Assignee: Nanoco Technologies Limited, Manchester (GB)

( * ) Notice: Subject to any disclaimer, the term of this patent is extended or adjusted under 35 U.S.C. 154(b) by 1037 days.

This patent is subject to a terminal disclaimer.

(21) Appl. No.: 11/588,880

(22) Filed: Oct. 27, 2006

(65) Prior Publication Data

US 2007/0104865 A1 May 10, 2007

(30) Foreign Application Priority Data

Oct. 28, 2005 (GB) ................................. 0522027.2

(51) Int. Cl.
*C30B 7/00* (2006.01)
*B82B 3/00* (2006.01)

(52) U.S. Cl. ........................ 427/214; 427/212; 427/215; 428/402; 428/403; 428/404; 428/405; 428/406

(58) Field of Classification Search ................. 427/212, 427/215; 428/403, 404, 405, 406
See application file for complete search history.

(56) References Cited

U.S. PATENT DOCUMENTS

| | | | |
|---|---|---|---|
| 3,524,771 | A | 8/1970 | Green |
| 4,609,689 | A | 9/1986 | Schwartz et al. |
| 6,114,038 | A | 9/2000 | Castro et al. |
| 6,207,229 | B1 | 3/2001 | Bawendi et al. |
| 6,221,602 | B1 | 4/2001 | Barbera-Guillem et al. |
| 6,261,779 | B1 | 7/2001 | Barbera-Guillem et al. |
| 6,322,901 | B1 | 11/2001 | Bawendi et al. |
| 6,326,144 | B1 | 12/2001 | Bawendi et al. |
| 6,333,110 | B1 | 12/2001 | Barbera-Guillem |
| 6,379,635 | B2 | 4/2002 | O'Brien et al. |
| 6,423,551 | B1 | 7/2002 | Weiss et al. |
| 6,426,513 | B1 | 7/2002 | Bawendi et al. |
| 6,607,829 | B1 | 8/2003 | Bawendi et al. |
| 6,660,379 | B1 | 12/2003 | Lakowicz et al. |
| 6,699,723 | B1 | 3/2004 | Weiss et al. |

(Continued)

FOREIGN PATENT DOCUMENTS

CN        1394599        2/2003

(Continued)

OTHER PUBLICATIONS

Barron, "Group III Materials: New Phases and Nano-particles with Applications in Electronics and Optoelectronics," (1999).*

(Continued)

*Primary Examiner*—Michael Cleveland
*Assistant Examiner*—Lisha Jiang
(74) *Attorney, Agent, or Firm*—Bingham McCutchen LLP

(57) ABSTRACT

A method of producing nanoparticles comprising effecting conversion of a nanoparticle precursor composition to the material of the nanoparticles, the precursor composition comprising a first precursor species containing a first ion to be incorporated into the growing nanoparticles and a second precursor species containing a second ion to be incorporated into the growing nanoparticles, said conversion being effected in the presence of a molecular cluster compound under conditions permitting seeding and growth of the nanoparticles.

62 Claims, 8 Drawing Sheets

Diagram of a) core particle, b) core-shell particle, c) core-multi shell organic capped particle

U.S. PATENT DOCUMENTS

| | | | |
|---|---|---|---|
| 6,815,064 B2 * | 11/2004 | Treadway et al. | 428/403 |
| 6,855,551 B2 | 2/2005 | Bawendi et al. | |
| 6,914,264 B2 | 7/2005 | Chen et al. | |
| 7,041,362 B2 | 5/2006 | Barbera-Guillem | |
| 7,151,047 B2 | 12/2006 | Chan et al. | |
| 7,235,361 B2 | 6/2007 | Bawendi et al. | |
| 7,264,527 B2 | 9/2007 | Bawendi et al. | |
| 2003/0017264 A1 | 1/2003 | Treadway et al. | |
| 2003/0106488 A1 | 6/2003 | Huang et al. | |
| 2003/0148024 A1 | 8/2003 | Kodas et al. | |
| 2004/0110002 A1 | 6/2004 | Kim et al. | |
| 2004/0110347 A1 | 6/2004 | Yamashita | |
| 2006/0019098 A1 | 1/2006 | Chan et al. | |
| 2006/0061017 A1 * | 3/2006 | Strouse et al. | 264/489 |
| 2006/0118757 A1 | 6/2006 | Klimov et al. | |
| 2007/0012941 A1 | 1/2007 | Cheon | |
| 2007/0059705 A1 | 3/2007 | Lu et al. | |
| 2007/0104865 A1 | 5/2007 | Pickett | |
| 2007/0110816 A1 | 5/2007 | Jun et al. | |
| 2007/0125983 A1 | 6/2007 | Treadway et al. | |
| 2007/0131905 A1 | 6/2007 | Sato et al. | |
| 2007/0199109 A1 | 8/2007 | Yl et al. | |
| 2007/0202333 A1 * | 8/2007 | O'Brien et al. | 428/402 |
| 2007/0238126 A1 | 10/2007 | Pickett et al. | |
| 2008/0121844 A1 | 5/2008 | Jang et al. | |
| 2008/0160306 A1 | 7/2008 | Mushtaq et al. | |
| 2008/0220593 A1 * | 9/2008 | Pickett et al. | 438/478 |
| 2008/0257201 A1 | 10/2008 | Harris et al. | |
| 2008/0264479 A1 | 10/2008 | Harris et al. | |
| 2009/0139574 A1 | 6/2009 | Pickett et al. | |
| 2009/0212258 A1 | 8/2009 | McCairn et al. | |
| 2009/0263816 A1 | 10/2009 | Pickett et al. | |

FOREIGN PATENT DOCUMENTS

| | | |
|---|---|---|
| GB | 9518910.6 | 9/1995 |
| GB | 2429838 A | 3/2007 |
| JP | 2005-139389 | 6/2005 |
| WO | WO 97/10175 | 3/1997 |
| WO | WO-00-17642 | 3/2000 |
| WO | WO-02-04527 | 1/2002 |
| WO | WO 02/29140 | 4/2002 |
| WO | WO 03/099708 | 4/2003 |
| WO | WO-2004008550 A2 | 1/2004 |
| WO | WO-2004-066361 A3 | 5/2004 |
| WO | WO-2004065362 A2 | 8/2004 |
| WO | WO-2005-021150 | 3/2005 |
| WO | WO 2004/033366 | 11/2005 |
| WO | WO 2005/106082 | 11/2005 |
| WO | WO-2005123575 A1 | 12/2005 |
| WO | WO-2006-017125 | 2/2006 |
| WO | WO-2006-116337 A2 | 2/2006 |
| WO | WO-2006075974 A1 | 7/2006 |
| WO | WO-2006118543 A1 | 11/2006 |
| WO | WO-2006134599 A1 | 12/2006 |
| WO | WO-2007020416 A1 | 2/2007 |
| WO | WO-2007-060591 A3 | 3/2007 |
| WO | WO-2007-049052 | 5/2007 |
| WO | WO-2007049052 A2 | 5/2007 |
| WO | WO-2007-065039 | 6/2007 |
| WO | WO-2007102799 A2 | 9/2007 |
| WO | WO-2008013780 A2 | 1/2008 |
| WO | WO-2008054874 A2 | 5/2008 |
| WO | WO-2008133660 A2 | 11/2008 |
| WO | WO-2009016354 A1 | 2/2009 |
| WO | WO-2009106810 A1 | 9/2009 |

OTHER PUBLICATIONS

Cumberland et al., "Inorganic Clusters as Single-Source Precursors for Preparation of CdSe, ZnSe, and CdSe/ZnS Nanomaterials," Chemistry of Materials (2002).*

Dabbousi et al. "(CdSe)ZnS Core—Shell Quantum Dots: Synthesis and Characterization of a Size Series of Highly Luminescent Nanocrystallites," Journal of Physical Chemistry (1997).*
Dehnen et al. "Chalcogen-Bridged Copper Clusters," European Journal of Inorganic Chemistry (2002).*
Eisenmann et al. "New Phosphido-bridged Multinuclear Complexes of Ag and Zn," Zeitschrift für anorganische und allgemeine Chemie (1995).*
Müller et al. "From Giant Molecular Clusters and Precursors to Solid-state Structures," Current Opinion in Solid State and Materials Science (Apr. 1999).*
Timoshkin, "Group 13 imido metallanes and their heavier analogs [RMYR']n (M = Al, Ga, In; Y=N, P, As, Sb)," Coordination Chemistry Reviews (2005).*
Vittal, "The chemistry of inorganic and organometallic compounds with adamantane-like structures," Polyhedron (1996).*
Cumberland et al., "Inorganic Clusters as Single-Source Precursors for Preparation of CdSe, ZnSe, and CdSe/ZnS Nanomaterials," Chemistry of Materials (2002).*
Agger, J.R. et al., *J. Phys. Chem. B* (1998) 102, p. 3345.
Aldana, J. et al., *J. Am. Chem. Soc.* (2001), 123: 8844.
Alivisatos, A.P., *J. Phys. Chem.*, (1996), 100, p. 13226.
Alivisatos, A.P., *J. Am. Chem. Soc.*, (1998) 120, p. 5343.
Bawendi, M.G., *Annu. Rev. Phys. Chem.* (1990), 42: 477.
Berry, C.R., *Phys. Rev.* (1967) 161:848.
Bunge, S.D. et al., *J. Mater. Chem.* (2003) 13: 1705.
Cumberland et al., "Inorganic Clusters as Single-Source Precursors for Preparation of CdSe, ZnSe, and CdSe/ZnS Nanomaterials" *Chemistry of Materials*, 14, pp. 1576-1584, (2002).
Eychmüller, A. et al., *Chem. Phys. Lett.* 208, p. 59. (1993).
Fendler, J.H. et al., *Adv. Mater.* (1995) 7: 607.
Gao, M. et al., *J. Chem. Soc. Commun.* (1994) 2779.
Guzelian, A. et al., *Appl. Phys. Lett.* (1996) 69: 1432.
Guzelian, A. et al., *J. Phys. Chem.* (1996) 100: 7212.
Hagfeldt, A. et al., *Chem. Rev.* (1995) 95: 49.
Henglein, A., *Chem Rev.* (1989) 89: 1861.
Jegier, J.A. et al., *Chem. Mater.* (1998) 10.
Kher, S. et al., *Chem. Mater.* (1994) 6: 2056.
Lieber, C. et al., *Angew. Chem. Int. Ed. Engl.* (1996) 35: 687.
Løver, T. et al., *J. Mater. Chem.* (1997) 7(4): 647.
Matijevic, E., *Ann. Rev. Mater. Sci.* (1985) 15: 483.
Matijevic, E., *Langmuir* (1986) 2:12.
Mekis, I. et al., *J. Phys. Chem. B.* (2003) 107: 7454.
Mićić et al., "Synthesis and Characterization of InP, GaP, and GaInP$_2$ Quantum Dots", *J. Phys.Chem.* (1995) pp. 7754-7759.
Murray, C.B. et al., "Synthesis and characterization of nearly monodisperse CdE (E = sulfur, selenium, tellurium) semiconductor nanocrystallites", *J. Am. Chem. Soc.* (1993) 115 (19) pp. 8706-8715.
Olshaysky, M.A., et al., *J. Am. Chem. Soc.* (1990) 112: 9438.
Peng et al., "Shape control of CdSe nanocrystals", *Nature*, (2000) vol. 404, No. 6773, pp. 59-61.
Pradhan, N. et al., *J. Am. Chem. Soc.* (2003) 125: 2050.
Qu, L. et al., *Nano Lett.* (2001)1: 333.
Salata, O.V. et al., *Appl. Phys. Letters* (1994) 65: 189.
Sercel, P.C. et al., *Appl. Phys. Letters* (1992) 61: 696.
Steigerwald, M.L. et al., *Acc. Chem. Res.* (1990) 23: 183.
Stroscio, J.A. et al., *Science* (1991), 254: 1319.
Trinidade et al., "A single source approach to the synthesis of CdSe nanocrystallites", *Advanced Materials*, vol. 8, No. 2, pp. 161-163. (1996).
Wang Y. et al., *J. Chem. Phys.* (1987) 87:7315.
Weller, H., *Adv. Mater.* (1993) 5:88.
Weller, H., *Angew. Chem. Int. Ed. Engl.* (1993) 32: 41.
Wells, R.L. et al., *Chem. Mater.* (1995) 7:793.
International Search Report for PCT/GB2005/001611 mailed Sep. 8, 2005 (5 pages).
Patents Act 1977: Search Report under Section 17 for Application No. GB0409877.8 dated Oct. 7, 2004 (1 page).
Patent Act 1977 Search Report under Section 17 for Application No. GB0522027.2 dated Jan. 27, 2006 (1 page).
Huang et al., "Bio-Inspired Fabrication of Antireflection Nanostructures by Replicating Fly Eyes" *Nanotechnology* (2008) vol. 19.

International Search Report for PCT/GB2006/003028 mailed Jan. 22, 2007 (5 pages).
Kim et al. "Engineering InAsxP1-x/InP/ZnSe III-V Alloyed Core-Shell Quantum Dots for the Near-Infrared" JACS Articles published on web Jul. 8, 2005.
Materials Research Society Symposium Proceedings *Quantum Dots, Nanoparticles and Nanowires*, 2004 ISSN: 0272-9172.
Nielsch et al., "Uniform Nickel Deposition into Ordered Alumina Pores by Pulsed Electrodeposition", *Advanced Materials*, 2000 vol. 12, No. 8, pp. 582-586.
Rao et al. (2004) "The Chemistry of Nanomaterials: Synthesis, Properties and Applications" p. 443.
Trinidade et al., "Nanocrystalline Seminconductors: Synthesis, Properties, and Perspectives", Chemistry of Materials, (2001) vol. 13, No. 11, pp. 3843-3858.
Xie et al. "Synthesis and Characterization of Highly Luminescent CdSe-Core CdS/Zn0.5Cd0.5S/ZnS Multishell Nanocrystals" JACS Articles published on web Apr. 29, 2005.
Zhong et al, "Composition-Tunable $Zn_xCu_1$-xSe Nanocrytals with High Luminescence and Stability", Jrl Amer. Chem. Soc. (2003).
International Search Report for PCT/GB2009/001928 mailed Dec. 8, 2009 (3 pages).
International Search Report for PCT/GB2009/002605 mailed Feb. 22, 2010 (3 pages).
Search Report for GB0813273.0 searched Dec. 8, 2008 (1 page).
Search Report for GB0814458.6 searched Dec. 5, 2008 (1 page).
Search Report for GB0820101.4 searched Mar. 3, 2009 (1 page).
Search Report for GB0821122.9 searched Mar. 19, 2009 (2 pages).
Arici et al., *Thin Solid Films* 451-452 (2004) 612-618.
Battaglia et al., "Colloidal Two-dimensional Systems: CdSe Quantum Shells and Wells," *Angew Chem.* (2003) 42:5035-5039.
Castro et al., "Synthesis and Characterization of Colloidal $CuInS_2$ Nanoparticles from a Molecular Single-Source Precursors," *J. Phys. Chem. B* (2004) 108:12429.
Castro et al., *Chem. Mater.* (2003) 15:3142-3147.
Chun et al., *Thin Solid Films* 480-481 (2005) 46-49.
Contreras et al., "ZnO/ZnS(O,OH)/Cu(In,Ga)$Se_2$/Mo Solar Cell with 18:6% Efficiency," from 3d World Conf. on Photovol. Energy Conv., *Late News Paper* (2003) pp. 570-573.
Cui et al., "Harvest of near infrared light in PbSe nanocrystal-polymer hybrid photovoltaic cells," *Appl. Physics Lett.* 88 (2006) 183111-1-183111-3.
Dance et al., *J. Am. Chem. Soc.* (1984) 106:6285-6295.
Daniels et al., "New Zinc and Cadmium Chalcogenide Structured Nanoparticles " *Mat. Res. Soc. Symp. Proc.* 789 (2004) pp. 31-36.
Gou et al., *J. Am. Chem. Soc.* (2006) 128:7222-7229.
Gur et al., "Air stable all-inorganic nanocrystal solar cells processed from solution," *Lawrence Berkeley Natl. Lab., Univ. of California*, paper LBNL-58424 (2005).
Gurin, *Colloids Surf. A* (1998) 142:35-40.
Hirpo et al., "Synthesis of Mixed Copper-Indium Chalcogenolates. Single-Source Precursors for the Photovoltaic Materials $CuInQ_2$ (Q = S, Se)," *J. Am. Chem. Soc.* (1993) 115:1597.
Hu et al., "Hydrothermal preparation of $CuGaS_2$ crystallites with different morphologies", *Sol. State Comm.* (2002) 121:493-496.
Jiang et al., *Inorg. Chem.* (2000) 39:2964-2965.
Kaelin et al., "CIS and CIGS layers from selenized nanoparticle precursors," *Thin Solid Films* 431-432 (2003) pp. 58-62.

Kapur et al., "Non-Vacuum processing of $CuIn_{1-x}Ga_xSe_2$ solar cells on rigid and flexible substrates using nanoparticle precursor inks," *Thin Solid Films* 431-432 (2003) pp. 53-57.
Kim et al., "Synthesis of $CuInGaSe_2$ Nanoparticles by Low Temperature Colloidal Route", *J. Mech. Sci. Tech.* (2005) 19: 2085-2090.
Law et al., "Nanowire dye-sensitized solar cells," *Nature Mater.* (2005) vol. 4 pp. 455-459.
Li et al. *Adv. Mat.* (1999) 11:1456-1459.
Little et al., "Formation of Quantum-dot quantum-well heteronanostructures with large lattice mismatch: Zn/CdS/ZnS," 114 *J. Chem. Phys.* 4 (2001).
Lu et al., *Inorg. Chem.* (2000) 39:1606-1607.
Malik et al., *Adv. Mat.*, (1999) 11:1441-1444.
Mews et al., *J. Phys. Chem.* (1994) 98:934-941.
Milliron et al., "Electroactive Surfactant Designed to Mediate Electron Transfer between CdSe Nanocrystals and Organic Semiconductors," *Adv. Materials* (2003) 15, No. 1, pp. 58-61.
Nairn et al., *Nano Letters* (2006) 6:1218-1223.
Nazeeruddin et al., "Conversion of Light to Electricity by cis-$X_2$Bis(2,2'bipyridy1-4,4'-dicarboxylate)ruthenium(II) Charge-Transfer Sensitizers (X= Cl$^-$, Br$^-$, I$^-$, CN$^-$, and SCN$^-$) on Nanocrystalline $TiO_2$ Electrodes," *J. Am. Chem. Soc.* (1993) 115:6382-6390.
Nazeeruddin et al., "Engineering of Efficient Panchromatic Sensitizers for Nanocrystalline $TiO_2$-Based Solar Cells," *J. Am. Chem. Soc.* (2001) 123:1613-1624.
O'Brien et al., "The Growth of Indium Selenide Thin Films from a Novel Asymmetric Dialkydiselenocarbamate," 3 *Chem. Vap. Depos.* 4, pp. 2227 (1979).
Olson et al., *J. Phys. Chem. C.* (2007) 111:16640-16645).
Patent Act 1977 Search Report under Section 17 for Application No. GB0723539.3 dated Mar. 27, 2008.
Patents Act 1977: Search Report under Section 17 for Application No. GB 0606845.6 dated Sep. 14, 2006.
Peng et al., "Kinetics of II-VI and III-V Colloidal Semiconductor Nanocrystal Growth: "Focusing" os Size Distributions", *J. Am. Chem. Soc.*, (1998) 129: 5343-5344.
Peng et al., *J. Am. Chem. Soc.* (2001) 123:1389.
Qi et al., "Efficient polymer-nanocrystal quantum-dot photodetectors," *Appl. Physics Lett.* 86 (2005) 093103-093103-3.
Robel et al., "Quantum Dot Solar Cells. Harvesting Light Energy with CdSe Nanocrystals Molecularly Linked to Mesoscopic $TiO_2$ Films," *J. Am. Chem. Soc.* (2006) 128: 2385-2393.
Shulz et al., *J. Elect. Mat.* (1998) 27:433-437.
Vayssieres et al., "Highly Ordered $SnO_2$ Nanorod Arrays from Controlled Aqueous Growth," *Angew. Chem. Int. Ed.* (2004) 43:3666-3670.
Xiao et al., *J. Mater. Chem.* (2001) 11:1417-1420.
Yang et al., *Crystal Growth & Design* (2007) 12/2562.
Yu et al., "Polymer Photovoltaic Cells: Enhanced Efficiencies via a Network of Internal Donor-Acceptor Heterojunctions," 270 *Science* 5243 (1995) , pp. 1789-1791.
Zhong et al., "A facile route to synthesize chalcopyrite $CuInSe_2$ nanocrystals in non-coordinating solvent", *Nanotechnology* 18 (2007) 025602.
Patents Act 1977: Search Report under Section17 for Application No. GB 0719073.9.
Patents Act 1977: Search Report under Section 17 for Application No. GB 0719075.4.

\* cited by examiner

Fig 1) Diagram of a) core particle, b) core-shell particle, c) core-multi shell organic capped particle Fig 2) Molecular cluster used as seeding agents Fig 3) Formation of a Cadmium selenide quantum dot using $[M_{10}Se_4(SPh)_{16}][X]4$ $x = Li+$ or $(CH_3)3NH+$ as the moleculaer seed and dropwise addition of cadmium acetate and tri-n-octylphosphine selenideas the cadmium and selenium element-source precursors and with Hexadecylamine used as the capping agent Fig 4) Formation of a Gallium sulfide quantum dot using [tBuGaS]7 as the molecualer seed with dropwisaddition of gallium(II)acetylacetonate and tri-n-octylphosphine sulfide as the gallium and sulfide element-source precursors and with Hexadecylamine used as the capping agent Fig 5) Formation of a indium selenide quantum dot using a molecular seed with dropwise addition of Indium(II)acetylacetonate and tri-n-octylphosphine sulfide as the Indium and selenide element-source precursors and with Hexadecylamine and tri-n-octylphosphine oxide used as the capping agent Figure 6
(A)
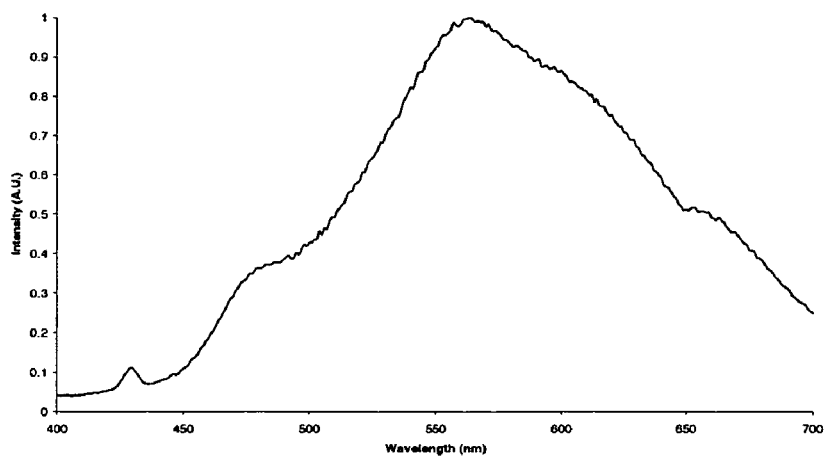
(B)
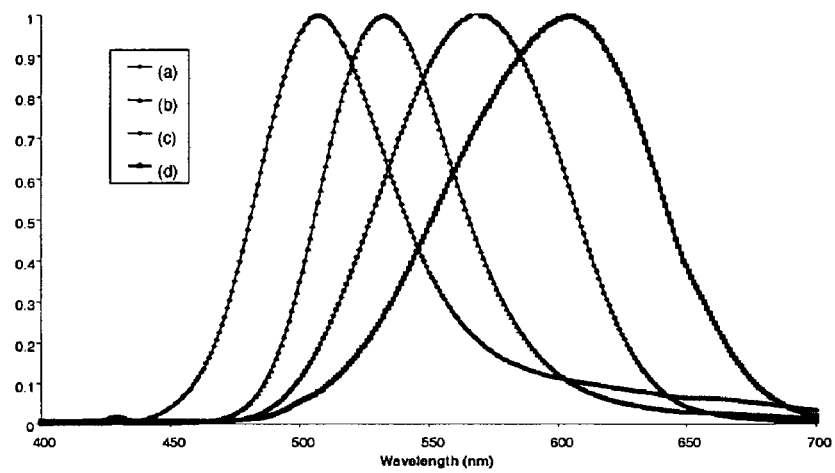
(C)
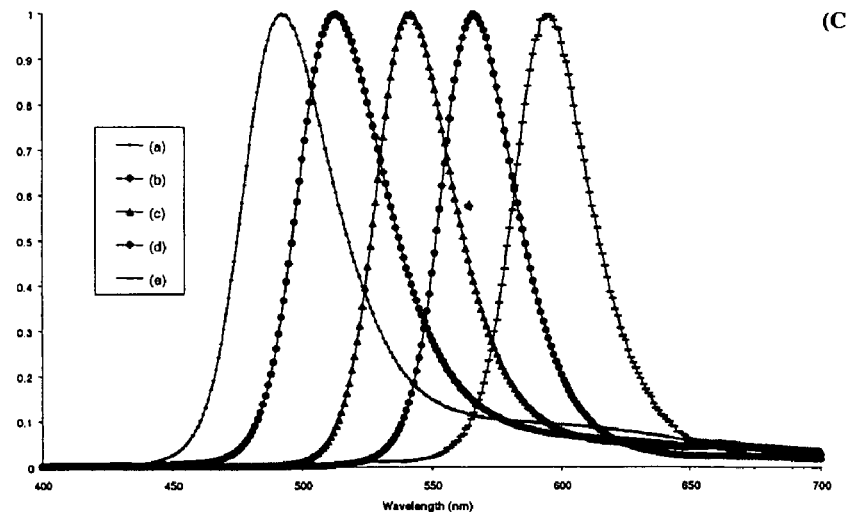

CONTROLLED PREPARATION OF NANOPARTICLE MATERIALS

RELATED APPLICATIONS

This application claims the benefit of, and priority to, British Patent Application No. 0522027.2, filed 28 Oct. 2005, incorporated herein in its entirety.

FIELD OF THE INVENTION

This application relates to the preparation of nanoparticles.

BACKGROUND

There has been substantial interest in the preparation and characterisation of compound semiconductors consisting of particles with dimensions in the order of 2-100 nm. Often referred to as quantum dots and/or nanocrystals, this is mainly because of their optical, electronic and chemical properties. These studies have occurred mainly due to their size-tuneable electronic, optical and chemical properties and the need for the further miniaturization of both optical and electronic devices that now range from commercial applications as diverse as biological labelling, solar cells, catalysis, biological imaging, light-emitting diodes amongst many new and emerging applications.

Although some earlier examples appear in the literature, recently methods have been developed from reproducible "bottom up" techniques, whereby particles are prepared atom-by-atom, i.e., from molecules to clusters to particles using "wet" chemical procedures. Rather from "top down" techniques involving the milling of solids to finer and finer powders.

To-date the most studied and prepared of semiconductor materials have been the chalcogenides II-VI materials namely ZnS, ZnSe, CdS, CdSe, CdTe; most noticeably CdSe due to its tuneability over the visible region of the spectrum. As mentioned semiconductor nanoparticles are of academic and commercial interest due to their differing and unique properties from those of the same material, but in the macro crystalline bulk form. Two fundamental factors, both related to the size of the individual nanoparticle, are responsible for their unique properties. The first is the large surface to volume ratio; as a particle becomes smaller, the ratio of the number of surface atoms to those in the interior increases. This leads to the surface properties playing an important role in the overall properties of the material. The second factor is that, with semiconductor nanoparticles, there is a change in the electronic properties of the material with size, moreover, the band gap gradually becoming larger because of quantum confinement effects as the size of the particles decreases. This effect is a consequence of the confinement of an 'electron in a box' giving rise to discrete energy levels similar to those observed in atoms and molecules, rather than a continuous band as in the corresponding bulk semiconductor material. Thus, for a semiconductor nanoparticle, because of the physical parameters, the "electron and hole", produced by the absorption of electromagnetic radiation, a photon, with energy greater then the first excitonic transition, are closer together than in the corresponding macrocrystalline material, so that the Coulombic interaction cannot be neglected. This leads to a narrow bandwidth emission, which is dependent upon the particle size and composition. Thus, quantum dots have higher kinetic energy than the corresponding macrocrystalline material and consequently the first excitonic transition (band gap) increases in energy with decreasing particle diameter.

Single core nanoparticles, which consist of a single semiconductor material along with an outer organic passivating layer, tend to have relatively low quantum efficiencies due to electron-hole recombination occurring at defects and dagling bonds situated on the nanoparticle surface which lead to non-radiative electron-hole recombinations. One method to eliminate defects and dangling bonds is to grow a second material, having a wider band-gap and small lattice mismatch with the core material, epitaxially on the surface of the core particle, (e.g. another II-VI material) to produce a "core-shell particle". Core-shell particles separate any carriers confined in the core from surface states that would otherwise act as non-radiative recombination centres. One example is ZnS grown on the surface of CdSe cores. The shell is generally a material with a wider bandgap then the core material and with little lattice mismatch to that of the core material, so that the interface between the two materials has as little lattice strain as possible. Excessive strain can further result in defects and non-radiative electron-hole recombination resulting in low quantum efficiencies.

The coordination about the final inorganic surface atoms in any core, core-shell or core-multi shell nanoparticles is incomplete, with highly reactive "dangling bonds" on the surface, which can lead to particle agglomeration. This problem is overcome by passivating (capping) the "bare" surface atoms with protecting organic groups. The capping or passivating of particles not only prevents particle agglomeration from occurring, it also protects the particle from its surrounding chemical environment, along with providing electronic stabilization (passivation) to the particles in the case of core material. The capping agent usually takes the form of a Lewis base compound covalently bound to surface metal atoms of the outer most inorganic layer of the particle, but more recently, so as to incorporate the particle into a composite, an organic system or biological system can take the form of, an organic polymer forming a sheaf around the particle with chemical functional groups for further chemical synthesis, or an organic group bonded directly to the surface of the particle with chemical functional groups for further chemical synthesis.

Many synthetic methods for the preparation of semiconductor nanoparticles have been reported, early routes applied conventional colloidal aqueous chemistry, with more recent methods involving the kinetically controlled precipitation of nanocrystallites, using organometallic compounds.

Over the past six years the important issues have concerned the synthesis of high quality semiconductor nanoparticles in terms of uniform shape, size distribution and quantum efficiencies. This has lead to a number of methods that can routinely produce semiconductor nanoparticles, with monodispersity of <5% with quantum yields >50%. Most of these methods are based on the original "nucleation and growth" method described by Murray, Norris and Bawendi, M. G. J. Am. Chem. Soc. 1993, 115, 8706, incorporated by reference in its entirety, but use other precursors than the organometallic ones used. Murray et al originally used organometallic solutions of metal-alkyls ($R_2M$) M=Cd, Zn, Te; R=Me, Et and tri-n-octylphosphine sulfide/selenide (TOPS/Se) dissolved in tri-n-octylphosphine (TOP). These precursor solutions are injected into hot tri-n-octylphosphine oxide (TOPO) in the temperature range 120-400° C. depending on the material being produced. This produces TOPO coated/capped semiconductor nanoparticles of II-VI material. The size of the particles is controlled by the temperature, concentration of precursor used and length of time at which the synthesis is undertaken, with larger particles being obtained at higher temperatures, higher precursor concentrations and prolonged reaction times. This organometallic route has advantages over other synthetic methods, including near monodispersity <5% and high particle cystallinity. As mentioned, many variations of this method have now appeared in the literature which routinely give high quality core and core-shell nanoparticles with monodispesity of <5% and quantum yield >50% (for core-shell particles of as-prepared solutions), with many methods displaying a high degree of size and shape control.

Recently attention has focused on the use of "greener" precursors that are less exotic and less expensive but not necessarily more environmentally friendly. Some of these new precursors include the oxides, CdO; carbonates $MCO_3$ M=Cd, Zn; acetates $M(CH_3CO_2)$ M=Cd, Zn and acetylacetanates $[CH_3COOCH=C(C-)CH_3]_2$ M=Cd, Zn; amongst others.

The use of the term "greener" precursors in semiconductor particle synthesis has generally taken on the meaning of cheaper, readily available and easier to handle precursor starting materials, than the originally used organometallics which are volatile and air and moisture sensitive, and does not necessarily mean that "greener precursors" are any more environmentally friendly.

Single-source precursors have also proved useful in the synthesis of semiconductor nanoparticle materials of II-VI, as well as other compound semiconductor nanoparticles. Bis(dialkyldithio-/diseleno-carbamato)cadmium(II)/zinc(II) compounds, $M(E_2CNR_2)_2$ (M=Zn or Cd, E=S or Se and R=alkyl), have used a similar 'one-pot' synthetic procedure, which involved dissolving the precursor in tri-n-octylphosphine (TOP) followed by rapid injection into hot tri-n-octylphosphine oxide/tri-n-octylphosphine (TOPO/TOP) above 200° C.

Due to their increased covalent nature III-V and IV-VI highly crystalline semiconductor nanoparticles are more difficult to prepare and much longer annealing time are usually required. However, there are now many reports of II-VI and IV-VI materials being prepared by a similar procedure GaN, GaP, GaAs, InP, InAs and for PbS and PbSe.

For all of the above methods, rapid particle nucleation followed by slow particle growth is essential for a narrow particle size distribution. All these synthetic methods are based on the original organometallic "nucleation and growth" method by Murray et al which involves the rapid injection of the precursors into a hot solution of a Lewis base coordinating solvent (capping agent) which may also contain one of the precursors. The addition of the cooler solution subsequently lowers the reaction temperature and assist particle growth but inhibits further nucleation. The temperature is then maintained for a period of time, with the size of the resulting particles depending on reaction time, temperature and ratio of capping agent to precursor used. The resulting solution is cooled followed by the addition of an excess of a polar solvent (methanol or ethanol or sometimes acetone) to produce a precipitate of the particles that can be isolated by filtration or centrifugation.

Fundamentally, these preparations rely on the principle of particle nucleation followed by growth. Moreover, to have a monodispersed ensemble of nanoparticles there is preferably proper separation of nanoparticles nucleation from nanoparticle growth with the later occurring at a lower temperature from the former. This is achieved by rapid injection of one or both precursors into a hot coordinating solvent (containing the other precursor if otherwise not present) which initiates particles nucleation, however, the sudden addition of the cooler solution upon injection subsequently lowers the reaction temperature (the volume of solution added is about ⅓ of the total solution) and inhibits further nucleation maintaining a narrow nanoparticle size distribution. Particle growth being a surface catalysis process or via Ostwald ripening, depending on the amount of precursor available to the growing particles continues at the lower temperature and thus nucleation and growth are separated. This method works well for small scale synthesis where one solution can be added rapidly to another while keeping an homogenous temperature throughout the reaction. However, on larger preparative scale whereby large volumes of solution are required to be rapidly injected into one another a temperature differential can occur within the reaction which can subsequently lead to a large particle size distribution.

Preparation from single-source molecular clusters, Cooney and co-workers used the cluster $[S_4Cd_{10}(SPh)_{16}]$ $[Me_3NH]_4$ to produce nanoparticles of CdS via the oxidation of surface-capping $SPh^-$ ligands by iodine. This route followed the fragmentation of the majority of clusters into ions which were consumed by the remaining $[S_4Cd_{10}(SPh)_{16}]^{4-}$ clusters which subsequently grow into nanoparticles of CdS. See LØver, T.; Bowmaker, G. A.; Seakins, J. M.; Cooney, R. P.; Henderson, W. *J. Mater. Chem.*, 1997, 7(4), 647, incorporated herein in its entirety. Strouse and co-workers used a similar synthetic approach but employed thermolysis (lyothermal-elevation of temperature) rather than a chemical agent to initiate particle growth. See Cumberland, S. L.; Hanif, K. M.; Javier, A., Khitov, K., A.; Strouse, G. F., Woessner, S. M., Yun, C. S., *Chem. Mater.* 2002, 14, 1576. Moreover, the single-source precursors $[M_{10}Se_4(SPh)_{16}]$ $[X]_4 X=Li^+$ or $(CH_3)_3NH^+$, M=Cd or Zn were thermolysised whereby fragmentation of some clusters occurs followed by growth of other from the scavenging of the free M and Se ions or simply from clusters aggregating to form larger clusters and then small nanoparticles which subsequently continue to grow into larger particles.

SUMMARY

A method of producing nanoparticles from a chemical precursor in the presence of a molecular cluster compound under conditions whereby the integrity of the molecular cluster is maintained this acts as a prefabricated seed template and reacts with chemical precursors present to produce nanoparticles, is described in co-pending International Patent Application No. PCT/GB2005/001611.

A feature of this invention is that conversion of the precursor composition to the nanoparticles is effected in the presence of a molecular cluster compound, whereby an identical molecule of the cluster compound acts as a seed or nucleation point upon which nanoparticle growth can be initiated. In this way, a high temperature nucleation step is not necessary to initiate nanoparticle growth because suitable nucleation sites are already provided in the system by the molecular clusters. The molecules of the cluster compound act as a template to direct nanoparticle growth. 'Molecular cluster' is a term which is widely understood in the relevant technical field but for the sake of clarity should be understood herein to relate to clusters of 3 or more metal atoms and their associated ligands of sufficiently well defined chemical structure such that all molecules of the cluster compound possess the same relative molecular formula. Thus the molecular clusters are identical to one another in the same way that one $H_2O$ molecule is identical to another $H_2O$ molecule. By providing nucleation sites which are so much more well defined than the nucleation sites employed in other methods, the use of the molecular cluster compound can provide a population of nanoparticles that are essentially monodisperse. A significant advantage of this method is that it can be more easily scaled-up. Methods of producing suitable molecular cluster compounds are known within the art, examples of which can be found at the Cambridge Crystallographic Data Centre (www.ccdc.ca.ac.uk).

According to a first aspect of the present invention, a method is provided for producing nanoparticles comprising effecting conversion of a nanoparticle precursor composition to the material of the nanoparticles, the precursor composition comprising a first precursor species containing a first ion to be incorporated into the growing nanoparticles and a second precursor species containing a second ion to be incorporated into the growing nanoparticles, the conversion being effected in the presence of a molecular cluster compound under conditions permitting seeding and growth of the nanoparticles, wherein the method comprises dispersing the molecular cluster compound and an initial portion of the nanoparticle precursor composition which is less than the total amount of the nanoparticle precursor composition to be used to produce the nanoparticles in a suitable dispersing medium at a first temperature; increasing the temperature of the dispersing medium containing the cluster compound and precursor composition to a second temperature which is sufficient to initiate seeding and growth of the nanoparticles on the molecular clusters of the molecular cluster compound; and adding one or more further portions of the nanoparticle precursor composition to the dispersing medium containing the growing nanoparticles, wherein the temperature of the dispersing medium containing the growing nanoparticles is increased before, during and/or after the addition of the or each further portion of the nanoparticle precursor composition.

According to a second aspect of the present invention, a method is provided for producing nanoparticles comprising effecting conversion of a nanoparticle precursor composition to the material of the nanoparticles, the precursor composition comprising a first precursor species containing a first ion to be incorporated into the growing nanoparticles and a separate second precursor species containing a second ion to be incorporated into the growing nanoparticles, the conversion being effected in the presence of a molecular cluster compound under conditions permitting seeding and growth of the nanoparticles, wherein the method comprises dispersing the molecular cluster compound and an initial portion of one of the first and second precursor species which is less than the total amount of one of the first and second precursor species to be used to produce the nanoparticles in a suitable dispersing medium at a first temperature; increasing the temperature of the dispersing medium containing the cluster compound and one of the first and second precursor species to a second temperature which is sufficient to initiate seeding and growth of the nanoparticles on the molecular clusters of the molecular cluster compound; and adding one or more further portions of the first and second precursor species to the dispersing medium containing the growing nanoparticles, wherein the temperature of the dispersing medium containing the growing nanoparticles is increased before, during and/or after the addition of the or each further portion of one of the first and second precursor species.

BRIEF DESCRIPTION OF FIGURES

The present invention is illustrated with reference to the following figures, in which:

FIG. 6A is a photoluminescence (PL) PL spectra of the isolated CdSe particles from the reaction of dimethylcadmium and trioctylphosphine selenide in HDA; FIG. 6B illustrates the evolution of the PL spectra showing the formation of cadmium selenide quantum dot using $[HNEt_3]_4[Cd_{10}Se_4(SPh)_{16}]$ as seeding template and $Me_2Cd.TOP$ and trioctylphosphine selenide with hexadecylamine used as the capping agent and reaction solvent at a reaction temperature of a) 185° C., b) 215° C., c) 250° C. after 10 minutes, d) 250° C. after 1 hour; FIG. 6C illustrates the evolution of the PL spectra showing the formation of cadmium selenide quantum dots using $[HNEt_3]_4[Cd_{10}Se_4(SPh)_{16}]$ as the molecular template and $Me_2Cd.TOP$ and trioctylphosphine selenide as the cadmium and selenium element-source precursors respectively. Hexadecylamine was used as the capping agent, followed by increasing the temperature and dropwise addition of $Me_2Cd.TOP$ and trioctylphosphine selenide a) at 165° C. and 20% of dimethyl cadmium added, b) at 185° C. and 30% of $Me_2Cd$ added, c) 230° C. and 60% of dimethyl cadmium added, d) 240° C. and 80% of dimethyl cadmium added, e) at 250° C. and 100% of dimethyl cadmium added;

DETAILED DESCRIPTION

Figure 1:
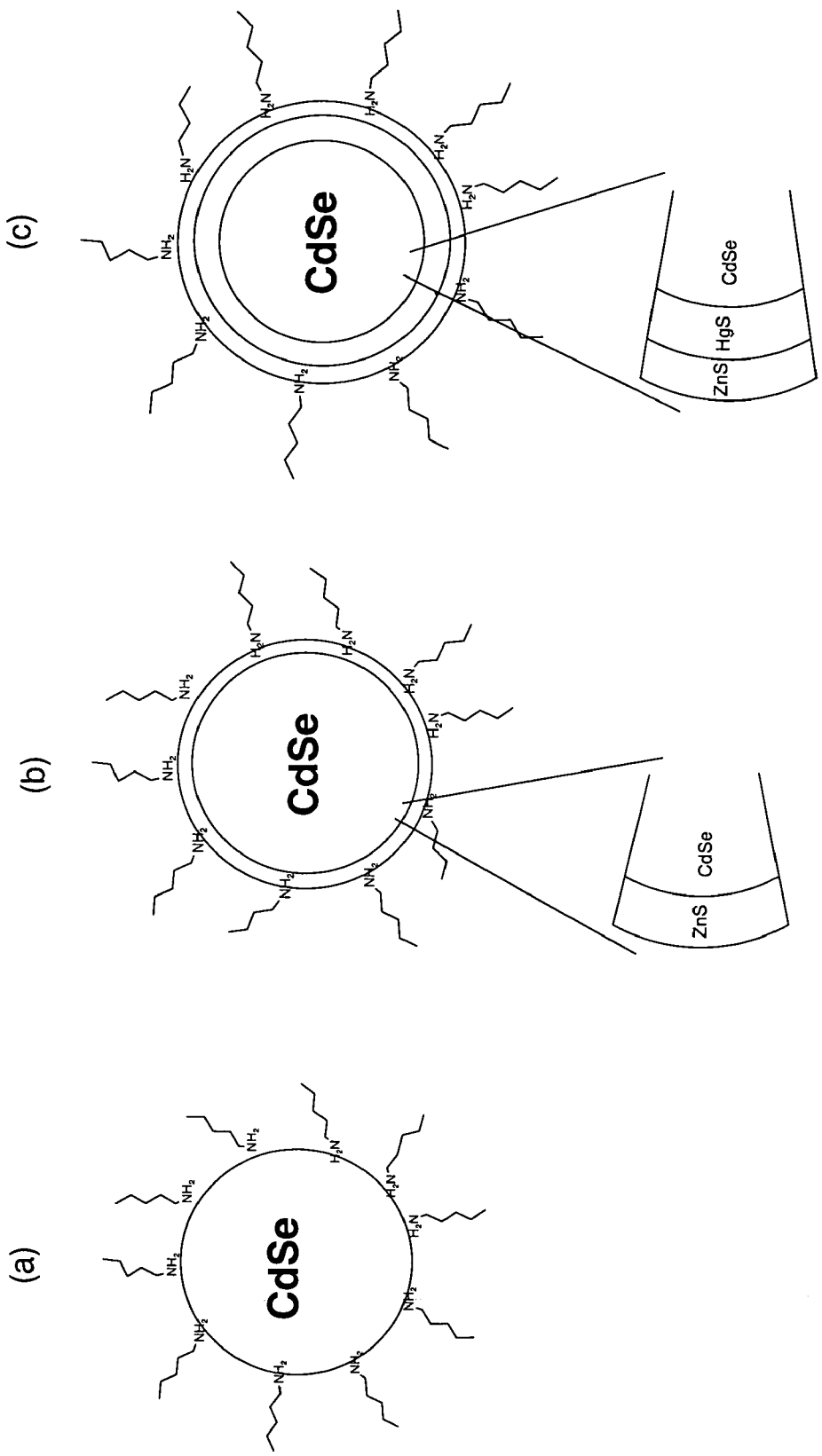
FIGS. 1a-1c illustrate the nanoparticles as follows: a) core particle consisting of a CdSe core and HDA as an organic capping agent, b) core-shell particle consisting of a CdSe core a ZnS shell and HDA as an organic capping agent, c) core-multi shell organic capped particle consisting of a CdSe core a HgS shell followed by a ZnS shell with a HDA capping agent.

In an embodiment, the present invention relates to methods of producing nanoparticles of any desirable form and allows ready production of a monodisperse population of such particles which are consequently of a high purity. It is envisaged that the invention is suitable for producing nanoparticles of any particular size, shape or chemical composition. A nanoparticle may have a size falling within the range 2-100 nm. A sub-class of nanoparticles of particular interest is that relating to compound semiconductor particles, also known as quantum dots or nanocrystals.

Aspects of the current invention concern the large scale synthesis of nanoparticles by the reaction whereby a seeding molecular cluster is placed in a solvent (coordinating or overwise) in the presence of other precursors to initiate particle growth. In an embodiment, the invention uses a similar technique to that disclosed in International Patent Application No. PCT/GB2005/001611 whereby a seeding molecular cluster is employed as a template to initiate particle growth from other precursors present within the reaction solution. The molecular cluster to be used as the seeding agent can either be prefabricated or produced in situ prior to acting as a seeding agent. In an aspect of the current invention, less than the total amount of precursor to be used to produce the nanoparticles is present in the dispersing medium with the cluster compound prior to the initiation of nanoparticle growth and then as the reaction proceeds and the temperature is increased, additional amounts of precursors are periodically added to the reaction mixture in the dispersing medium. Preferably the additional precursors are added either dropwise as a solution or as a solid.

Methods in accordance with the present invention concern the conversion of a nanoparticle precursor composition to a desired nanoparticle. Suitable precursors in respect of the first aspect of the present invention include single-source precursors in which the two or more ions to be incorporated in to the growing nanoparticle, or multi-source precursors in which two or more separate precursors each of which contains at least one ion to be included in the growing nanoparticle. Suitable precursors in respect of the second aspect of the present invention include multi-source precursors.

The temperature of the dispersing medium containing the growing nanoparticles may be increased at any appropriate rate depending upon the nature of the nanoparticle precursor composition and the molecular cluster compound being used. Preferably the temperature of the dispersing medium is increased at a rate in the range 0.05° C./min to 1° C./min, more preferably at a rate in the range 0.1° C./min to 1° C./min, and most preferably the temperature of the dispersing medium containing the growing nanoparticles is increased at a rate of approximately 0.2° C./min. The temperature of the dispersing medium may be increased from the first temperature to the second temperature at a rate of 0.05° C./min to 2° C./min, more preferably 0.5° C./min to 1.5° C./min.

Any suitable molar ratio of the molecular cluster compound to first and second nanoparticle precursors may be used depending upon the structure, size and composition of the nanoparticles being formed, as well as the nature and concentration of the other reagents, such as the nanoparticle precursor(s), capping agent, size-directing compound and solvent. It has been found that particularly useful ratios of the number of moles of cluster compound compared to the total number of moles of the first and second precursor species preferably lie in the range 0.0001-0.1 (no. moles of cluster compound): 1 (total no. moles of first and second precursor species), more preferably 0.001-0.1:1, yet more preferably 0.001-0.060:1. Further preferred ratios of the number of moles of cluster compound compared to the total number of moles of the first and second precursor species lie in the range 0.002-0.030:1, and more preferably 0.003-0.020:1. In particular, it is preferred that the ratio of the number of moles of cluster compound compared to the total number of moles of the first and second precursor species lies in the range 0.0035-0.0045:1.

It is envisaged that any suitable molar ratio of the first precursor species compared to the second precursor species may be used. For example, the molar ratio of the first precursor species compared to the second precursor species may lie in the range 100-1 (first precursor species): 1 (second precursor species), more preferably 50-1:1. Further preferred ranges of the molar ratio of the first precursor species compared to the second precursor species lie in the range 40-5:1, more preferably 30-10:1. In certain applications it is preferred that approximately equal molar amounts of the first and second precursor species are used in the method of the invention. The molar ratio of the first precursor species compared to the second precursor species preferably lies in the range 0.1-1.2:1, more preferably, 0.9-1.1:1, and most preferably 1:1. In other applications, it may be appropriate to use approximately twice the number of moles of one precursor species compared to the other precursor species. Thus the molar ratio of the first precursor species compared to the second precursor species may lie in the range 0.4-0.6:1, more preferably the molar ratio of the first precursor species compared to the second precursor species is 0.5:1. It is to be understood that the above precursor molar ratios may be reversed such that they relate to the molar ratio of the second precursor species compared to the first precursor species. Accordingly, the molar ratio of the second precursor species compared to the first precursor species may lie in the range 100-1 (second precursor species): 1 (first precursor species), more preferably 50-1:1, 40-5:1, or 30-10:1. Furthermore, the molar ratio of the second precursor species compared to the first precursor species may lie in the range 0.1-1.2:1, 0.9-1.1:1, 0.4-0.6:1, or may be 0.5:1.

It is preferred that the first ion is selected from the group consisting of group 2 of the periodic table, group 12 of the periodic table, group 13 of the periodic table and group 14 of the periodic table.

Preferably the second ion is selected from the group consisting of group 14 of the periodic table, group 15 of the periodic table and group 16 of the periodic table.

While the first and second temperatures of the dispersing medium may take any suitable value, in a preferred embodiment of the first aspect of the present invention the first temperature is in the range 15° C. to 60° C. The second temperature may be in the range 90° C. to 150° C. In a preferred embodiment of the second aspect of the present invention the first temperature is in the range 15° C. to 80° C. The second temperature may be in the range 140° C. to 300° C.

It is preferred that the or each further portion of the nanoparticle precursor composition is added dropwise to the dispersing medium containing the growing nanoparticles.

The or each further portion of the nanoparticle precursor composition may be added to the dispersing medium containing the growing nanoparticles at any desirable rate. It is preferred that the precursor composition is added to the dispersing medium at a rate in the range 0.1 ml/min to 20 m/min per litre of dispersing medium, more preferably at a rate in the range 1 m/min to 15 m/min per litre of dispersing medium, and most preferably at a rate of around 5 ml/min per litre of dispersing medium.

Preferably the initial portion of the nanoparticle precursor composition is less than or equal to approximately 90% of the total amount of the nanoparticle precursor composition to be used to produce the nanoparticles. The initial portion of the nanoparticle precursor composition may be less than or equal to approximately 10% of the total amount of the nanoparticle precursor composition to be used to produce the nanoparticles.

In a preferred embodiment where one further portion of the nanoparticle precursor composition is added to the dispersing medium containing the growing nanoparticles, the one further portion is less than or equal to approximately 90% of the total amount of the nanoparticle precursor composition to be used to produce the nanoparticles.

In a further preferred embodiment where more than one further portion of the nanoparticle precursor composition is added to the dispersing medium containing the growing nanoparticles, each of the further portions is less than or equal to approximately 45% of the total amount of the nanoparticle precursor composition to be used to produce the nanoparticles. Each of the further portions may be less than or equal to approximately 10% of the total amount of the nanoparticle precursor composition to be used to produce the nanoparticles.

Preferably, formation of the molecular cluster compound is effected in situ in the dispersing medium prior to dispersing the molecular cluster compound and the initial portion of the nanoparticle precursor composition in the dispersing medium.

In a preferred embodiment of the present invention, the process is subject to the proviso that the nanoparticle precursor composition does not contain $Cd(CH_3CO_2)_2$. A further preferred embodiment provides that the process is subject to the proviso that the nanoparticle precursor composition does not contain TOPSe. The process may be subject to the proviso that the nanoparticle precursor composition does not contain $Cd(CH_3CO_2)_2$ and TOPSe. In a still further preferred embodiment the process is subject to the proviso that the temperature of the dispersing medium containing the growing nanoparticles is increased at a rate which is other than 50° C. over a period of 24 hours.

With regard to the method forming the second aspect of the present invention, it is preferred that the method further comprises adding to the dispersing medium when the dispersing medium is at the second temperature an initial portion of the other of the first and second precursor species which is less than the total amount of the other of the first and second precursor species to be used to produce the nanoparticles.

Preferably one or more further portions of the other of the first and second precursor species are added to the dispersing medium containing the growing nanoparticles.

The temperature of the dispersing medium containing the growing nanoparticles may be increased before, during and/or after the addition of the or each further portion of the other of the first and second precursor species.

It is preferred that the temperature of the dispersing medium containing the growing nanoparticles is maintained at approximately the second temperature during the addition of the or each further portion of the other of the first and second precursor species.

Nanoparticle growth may be terminated by reducing the temperature of the solution from the second temperature to a third temperature.

The conversion of the precursor to the material of the nanoparticles can be conducted in any suitable solvent. In the method of the present invention it is important to maintain the integrity of the molecules of the cluster compound. Consequently, when the cluster compound and nanoparticle precursor are introduced into the solvent, the temperature of the solvent is preferably sufficiently high to ensure satisfactory dissolution and mixing of the cluster compound. It is not necessary that the present compounds are fully dissolved but desirable. It is most preferred that the temperature of the dispersing medium containing the cluster and precursors is not be so high as to disrupt the integrity of the cluster compound molecules. Once the cluster compound and precursor composition are sufficiently well dissolved in the solvent, the temperature of the solution thus formed is raised to a temperature, or range of temperatures, which is/are sufficiently high to initiate nanoparticle growth but not so high as to damage the integrity of the cluster compound molecules. As the temperature is increased further, quantities of precursor are added to the reaction, preferably in a dropwise manner or as a solid. The temperature of the solution can then be maintained at this temperature or within this temperature range for as long as required to form nanoparticles possessing the desired properties.

A wide range of appropriate solvents are available. The particular solvent used is usually at least partly dependent upon the nature of the reacting species, i.e., nanoparticle precursor and/or cluster compound, and/or the type of nanoparticles which are to be formed. Typical solvents include Lewis base type coordinating solvents, such as a phosphine (e.g. TOP), a phosphine oxide (e.g. TOPO) or an amine (e.g. HDA), or non-coordinating organic solvents, e.g. alkanes and alkenes. If a non-coordinating solvent is used then it will usually be used in the presence of a further coordinating agent to act as a capping agent for the following reason.

If the nanoparticles being formed are intended to function as quantum dots it is important that the surface atoms which are not fully coordinated "dangling bonds" are capped to minimise non-radiative electron-hole recombinations and inhibit particle agglomeration which can lower quantum efficiencies or form aggregates of nanoparticles. A number of different coordinating solvents are known which can also act as capping or passivating agents, e.g. TOP, TOPO, had or long chain organic acids such as myristic acid. If a solvent is chosen which cannot act as a capping agent then any desirable capping agent can be added to the reaction mixture during nanoparticle growth. Such capping agents are typically Lewis bases but a wide range of other agents are available, such as oleic acid and organic polymers which form protective sheaths around the nanoparticles.

Aspects of the invention include methods to produce nanoparticle materials mainly but not restricted to compound semiconductor nanoparticles from the use of molecular clusters, whereby the clusters are defined identical molecular entities, as compared to ensembles of small nanoparticles, which inherently lack the anonymous nature of molecular clusters. The invention employs molecular clusters as templates to seed the growth of nanoparticles, whereby other molecular sources, i.e., the precursor compounds, or "molecular feedstocks" are consumed to facilitate particle growth. The molecular sources (i.e., precursor composition) are periodically added to the reaction solution so as to keep the concentration of free ions to a minimum but also maintain a concentration of free ions to inhibit Oswards ripening from occurring and defocusing of nanoparticle size range from occuring.

Feedstocks

These molecular feedstocks can be in the form of a single-source precursor whereby all elements required within the as to be growth nanoparticle are present within a single compound precursor or a combination of precursors each containing one or more element/ion required within the as to be grown nanoparticles. A portion of the feedstocks is added at the beginning of the reaction and further portions added periodically throughout the reaction of particle growth. These feedstock can be in the form of a liquid, a solution, solid, slurry or gas.

In Situ Formation of Seeding Cluster

The cluster to be employed as the seeding template may be prefabricated prior to the reaction and added to the reaction solution at the beginning of the reaction process or formed in situ in the reaction solution prior to the addition of precursors used for the growth of the nanoparticles.

Conditions for Nanoparticle Growth

Nanoparticles growth which requires the increase in temperature of the dispersing medium in which growth is to occur may be initiated by heating (thermolysis), changing of the reaction conditions such as adding a base or an acid, elevation of pressures i.e., using pressures much greater than atmospheric pressure, microwave or other electromagnetic radiation.

Type of System to be Made

An aspect of the present invention is directed to the preparation of a number of nanoparticles materials and includes compound semiconductor particles otherwise referred to as quantum dots or nanocrystals, within the size range 2-100 nm and include core material comprising:

IIA-VIB (2-16) material, consisting of a first element from group 2 of the periodic table and a second element from group 16 of the periodic table and also including ternary and quaternary materials and doped materials.

Nanoparticle material include but are not restricted to: MgS, MgSe, MgTe, CaS, CaSe, CaTe, SrS, SrSe, SrTe, BaS, BaSe, BaTe.

IIB-VIB (12-16) material consisting of a first element from group 12 of the periodic table and a second element from group 16 of the periodic table and also including ternary and quaternary materials and doped materials.

Nanoparticle material includes but are not restricted to: ZnS, ZnSe, ZnTe, CdS, CdSe, CdTe, HgS, HgSe, HgTe.

II-V material consisting of a first element from group 12 of the periodic table and a second element from group 15 of the periodic table and also including ternary and quaternary materials and doped materials. Nanoparticle material include but is not restricted to: $Zn_3P_2$, $Zn_3As_2$, $Cd_3P_2$, $Cd_3As_2$, $Cd_3N_2$, $Zn_3N_2$.

III-V material consisting of a first element from group 13 of the periodic table and a second element from group 15 of the periodic table and also including ternary and quaternary materials and doped materials. Nanoparticle material include but is not restricted to: BP, AlP, AlAs, AlSb; GaN, GaP, GaAs, GaSb; InN, InP, InAs, InSb, AlN, BN.

III-IV material consisting of a first element from group 13 of the periodic table and a second element from group 14 of the periodic table and also including ternary and quaternary materials and doped materials. Nanoparticle material include but is not restricted to: $B_4C$, $Al_4C_3$, $Ga_4C$.

III-VI material consisting of a first element from group 13 of the periodic table and a second element from group 16 of the periodic table and also including ternary and quaternary materials. Nanoparticle material include but is not restricted to: $Al_2S_3$, $Al_2Se_3$, $Al_2Te_3$, $Ga_2S_3$, $Ga_2Se_3$, GeTe; $In_2S_3$, $In_2Se_3$, $Ga_2Te_3$, $In_2Te_3$, InTe.

IV-VI material consisting of a first element from group 14 of the periodic table and a second element from group 16 of the periodic table, and also including ternary and quaternary materials and doped materials. Nanoparticle material include but is not restricted to: PbS, PbSe, PbTe, $Sb_2Te_3$, SnS, SnSe, SnTe.

Nanoparticle material consisting of a first element from any group in the transition metal of the periodic table, and a second element from any group of the d-block elements of the periodic table and also including ternary and quaternary materials and doped materials. Nanoparticle material include but is not restricted to: NiS, CrS, $CuInS_2$.

The term doped nanoparticle for the purposes of specifications and claims refers to nanoparticles of the above and a dopant comprising one or more main group or rare earth elements, this most often is a transition metal or rare earth element, such as but not limited to zinc sulfide with manganese, such as ZnS nanoparticles doped with $Mn^+$.

Ternary Phase

By the term ternary phase nanoparticle for the purposes of specifications and claims, refer to nanoparticles of the above but a three component material. The three components are usually compositions of elements from the as mentioned groups Example being $(Zn_xCd_{x-1}S)_mL_n$ nanocrystal (where L is a capping agent).

Quaternary Phase

By the term quaternary phase nanoparticle for the purposes of specifications and claims, refer to nanoparticles of the above but a four-component material. The four components are usually compositions of elements from the as mentioned groups Example being $(Zn_xCd_{x-1}SySe_{y-1})_mL_n$ nanocrystal (where L is a capping agent).

Solvothermal

By the term Solvothermal for the purposes of specifications and claims, refer to heating the reaction solution so as to initiate and sustain particle growth and can also take the meaning solvothermal, thermolysis, thermolsolvol, solution-pyrolysis, lyothermal.

Core-Shell and Core/Multi Shell Particles

The material used on any shell or subsequent numbers of shells grown onto the core particle in most cases will be of a similar lattice type material to the core material i.e., have close lattice match to the core material so that it can be epitaxially grown on to the core, but is not necessarily restricted to materials of this compatibility. The material used on any shell or subsequent numbers of shells grown on to the core present in most cases will have a wider band-gap then the core material but is not necessarily restricted to materials of this compatibility. The materials of any shell or subsequent numbers of shells grown on to the core can include material comprising of:

IIA-VIB (2-16) material, consisting of a first element from group 2 of the periodic table and a second element from group 16 of the periodic table and also including ternary and quaternary materials and doped materials. Nanoparticle material include but is not restricted to: MgS, MgSe, MgTe, CaS, CaSe, CaTe, SrS, SrSe, SrTe, BaS, BaSe, BaTe.

IIB-VIB (12-16) material consisting of a first element from group 12 of the periodic table and a second element from group 16 of the periodic table and also including ternary and quaternary materials and doped materials. Nanoparticle material include but is not restricted to: ZnS, ZnSe, ZnTe, CdS, CdSe, CdTe, HgS, HgSe, HgTe.

II-V material consisting of a first element from group 12 of the periodic table and a second element from group 15 of the periodic table and also including ternary and quaternary materials and doped materials. Nanoparticle material include but is not restricted to:—$Zn_3P_2$, $Zn_3As_2$, $Cd_3P_2$, $Cd_3As_2$, $Cd_3N_2$, $Zn_3N_2$.

III-V material consisting of a first element from group 13 of the periodic table and a second element from group 15 of the periodic table and also including ternary and quaternary materials and doped materials. Nanoparticle material include but is not restricted to: BP, AlP, AlAs, AlSb; GaN, GaP, GaAs, GaSb; InN, InP, InAs, InSb, AlN, BN.

III-IV material consisting of a first element from group 13 of the periodic table and a second element from group 14 of the periodic table and also including ternary and quaternary materials and doped materials. Nanoparticle material include but is not restricted to: $B_4C$, $Al_4C_3$, $Ga_4C$.

III-VI material consisting of a first element from group 13 of the periodic table and a second element from group 16 of the periodic table and also including ternary and quaternary materials. Nanoparticle material include but is not restricted to: $Al_2S_3$, $Al_2Se_3$, $Al_2Te_3$, $Ga_2S_3$, $Ga_2Se_3$, GeTe; $In_2S_3$, $In_2Se_3$, $Ga_2Te_3$, $In_2Te_3$ InTe.

IV-VI material consisting of a first element from group 14 of the periodic table and a second element from group 16 of the periodic table and also including ternary and quaternary materials and doped materials. Nanoparticle material include but is not restricted to: PbS, PbSe, PbTe, $Sb_2Te_3$, SnS, SnSe, SnTe.

Nanoparticle material consisting of a first element from any group in the transition metal of the periodic table, and a second element from any group of the d-block elements of the periodic table and also including ternary and quaternary materials and doped materials. Nanoparticle material include but is not restricted to: NiS, CrS, $CuInS_2$, $CuInSe_2$.

Outer Most Particle Layer

Capping Agent

The outer most layer (capping agent) of organic material or sheath material is to inhibit particles aggregation and to protect the nanoparticle from the surrounding chemical environment and to provide a means of chemical linkage to other inorganic, organic or biological material. The capping agent can be the solvent that the nanoparticle preparation is undertaken in, and consists of a Lewis base compound whereby there is a lone pair of electrons that are capable of donor type coordination to the surface of the nanoparticle and can include mono- or multi-dentate ligands of the type but not restricted to:—phosphines (trioctylphosphine, triphenolphosphine, t-butylphosphine), phosphine oxides (trioctylphosphine oxide), alkyl-amine (hexadecylamine, octylamine), ary-amines, pyridines, and thiophenes.

The outer most layer (capping agent) can consist of a coordinated ligand that processes a functional group that can be used as a chemical linkage to other inorganic, organic or biological material such as but not restricted to: mercaptofunctionalized amines or mercaptocarboxylic acids.

The outer most layer (capping agent) can consist of a coordinated ligand that processes a functional group that is polymerisable and can be used to form a polymer around the particle, polymerisable ligands such as but not limited to styrene functionalized amine, phosphine or phosphine oxide ligand.

Nanoparticle Shape

The shape of the nanoparticle is not restricted to a sphere and can consist of but not restricted to a rod, sphere, disk, tetrapod or star. The control of the shape of the nanoparticle is by the addition of a compound that will preferentially bind to a specific lattice plane of the growing particle and subsequently inhibit or slow particle growth in a specific direction. Example of compounds that can be added but is not restricted to include: phosphonic acids (n-tetradecylphosphonic acid, hexylphoshonic acid, 1-decanesulfonic acid, 12-hydroxydodecanoic acid, n-octadecylphosphonic acid).

Description of Preparative Procedure

The current invention may lead to pure, monodispersed, nanocrystalline particles that may be stabilized from particle aggregation and the surrounding chemical environment by an organic layer, where M and E are two different elements in a $(ME)_nL_y$ particles and L being the coordinating organic layer/capping agent, such as a II-VI semiconductor $(ZnS)_n(TOPO)_y$, nanoparticle constituting of a ZnS core surrounded by trioctylphosphine oxide ligands (TOPO).

Dropwise Addition

Figure 2:
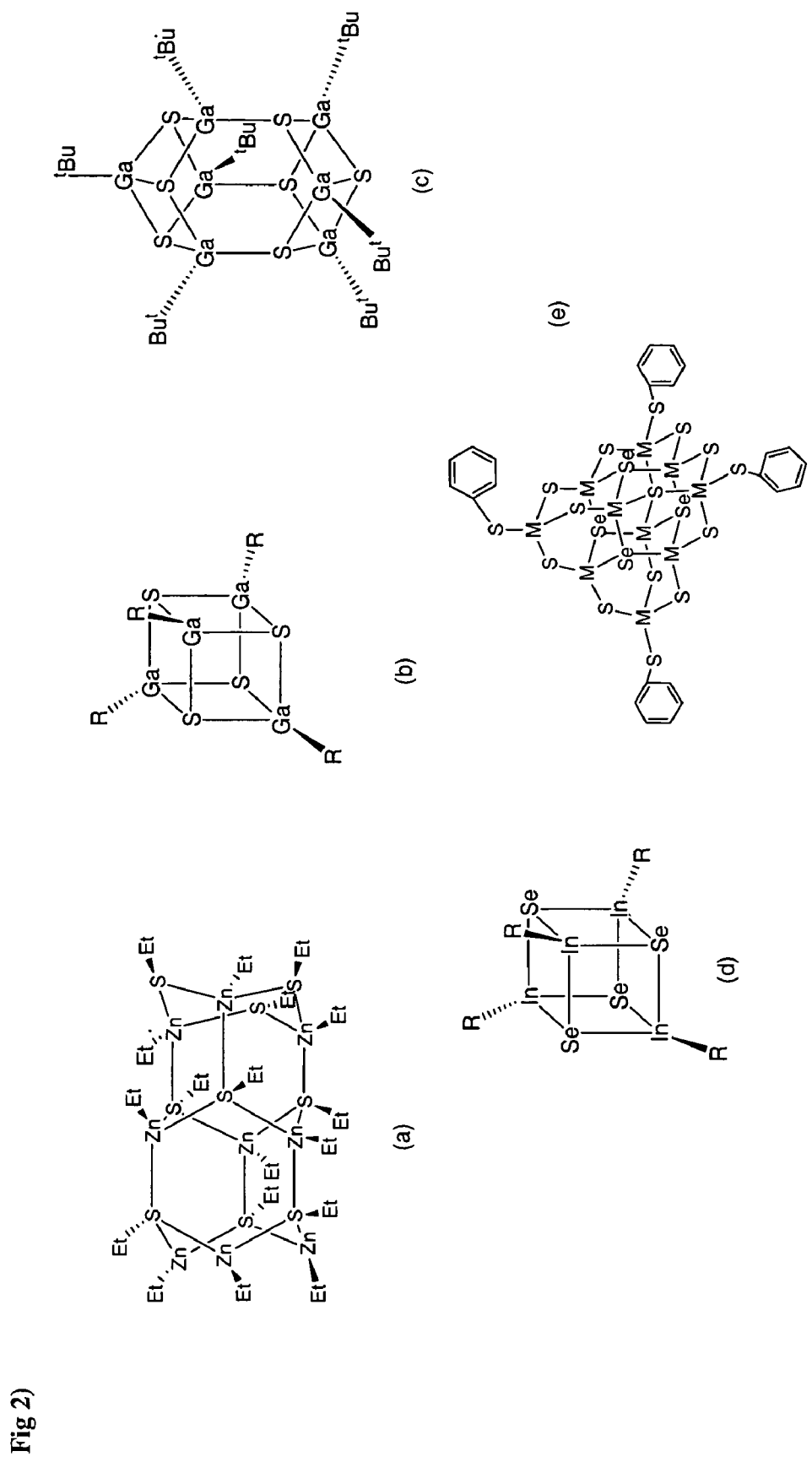
FIGS. 2a-2e illustrate the following molecular clusters used as seeding agents: a) $Zn_{10}(SEt)_{10}Et_{10}$; b) $[RGaS]_4$; c) $[Bu^tGaS]_7$; d) $[RInSe]_4$; and e) $[X]_4[M_{10}Se_4(SPh)_{16}]$ X=cation, M=Zn, Cd, Te.
Figure 3:
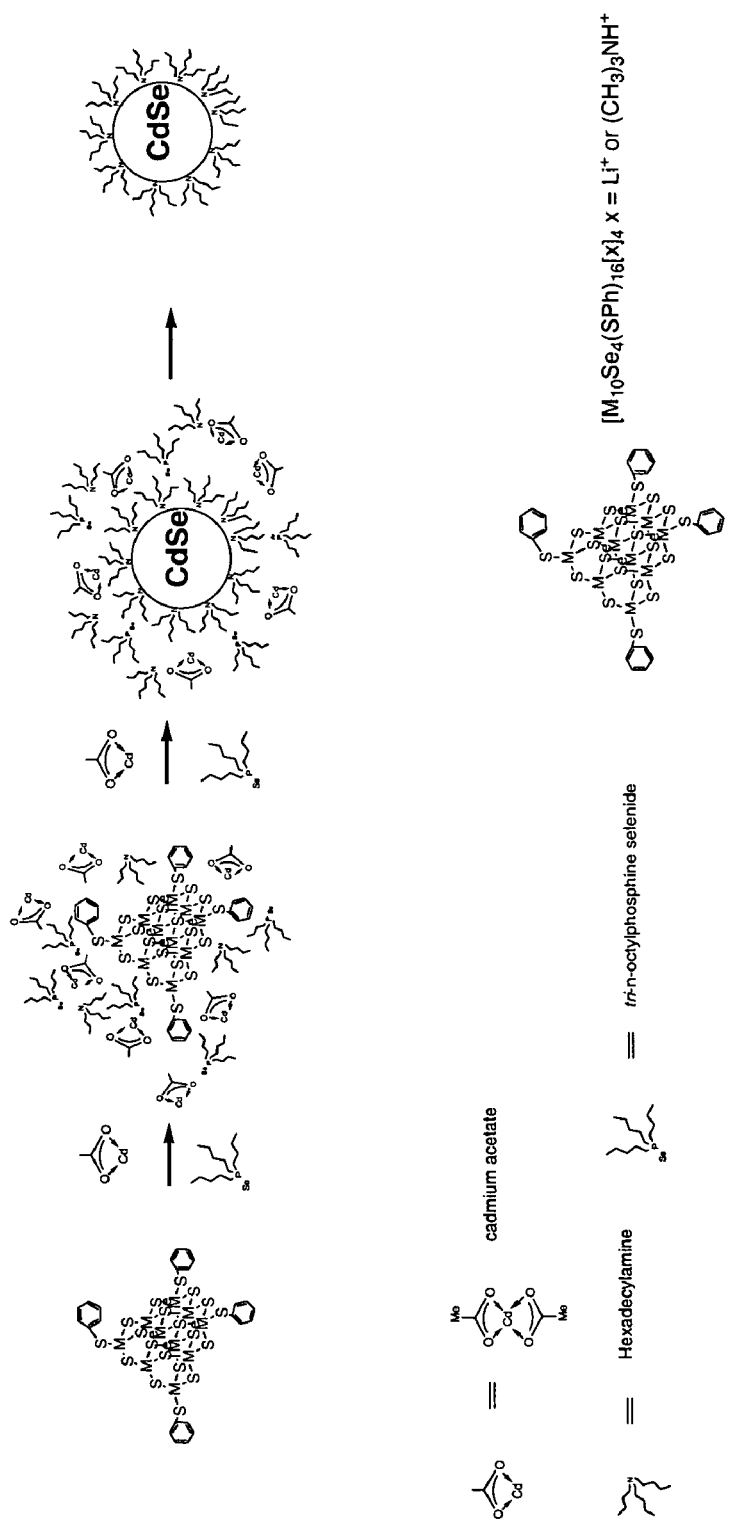
FIG. 3 illustrates the formation of a cadmium selenide quantum dot using $[M_{10}Se_4(SPh)_{16}][X]_4$ $X=Li^+$ or $(CH_3)_3NH^+$, $Et_3NH^+$ as the molecular seed and cadmium acetate and tri-n-octylphosphine selenide as the cadmium and selenium element-source precursors and with Hexadecylamine used as the capping agent.
Figure 4:
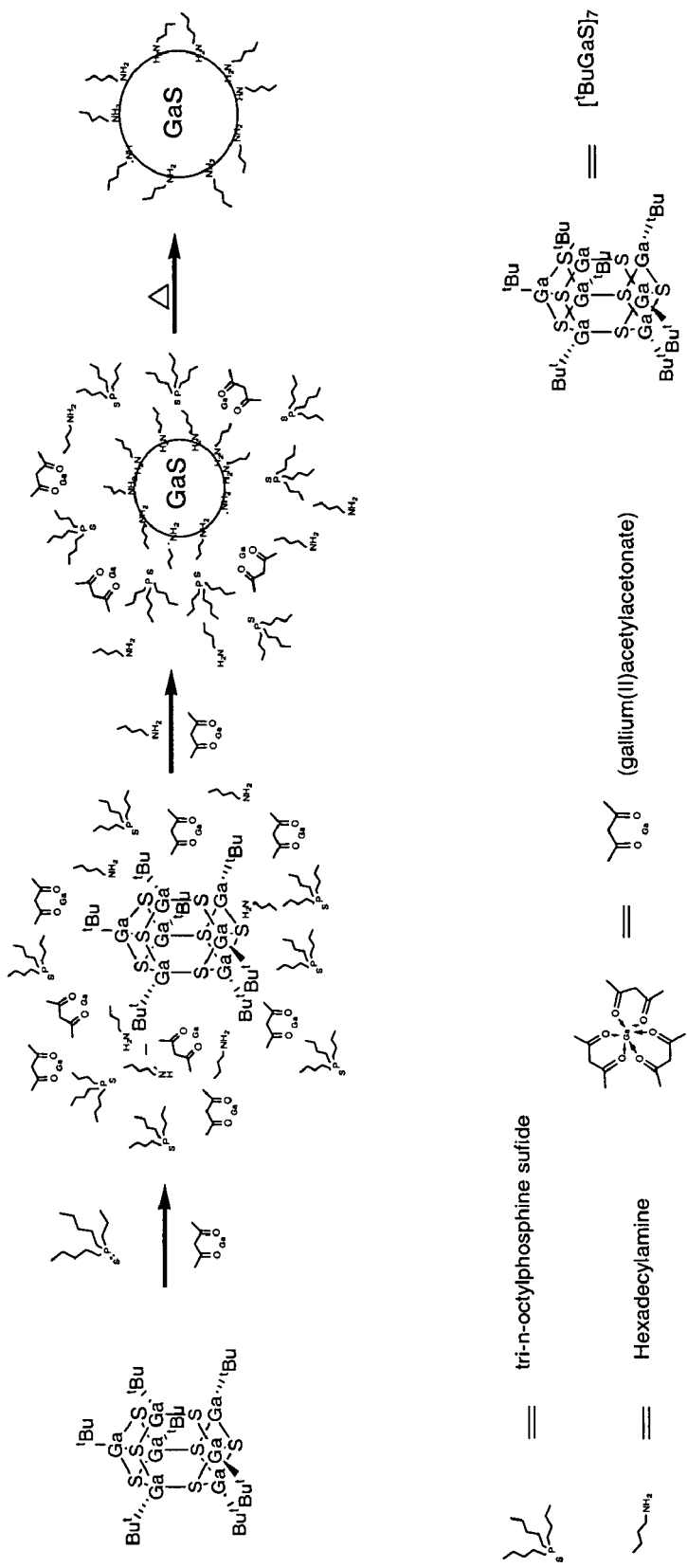
FIG. 4 illustrates the formation of a gallium sulfide quantum dot using $[^tBuGaS]_7$ as the molecular seed and gallium (II)acetylacetonate and tri-n-octylphosphine sulfide as the gallium and sulfide element-source precursors and with Hexadecylamine used as the capping agent.
Figure 5:
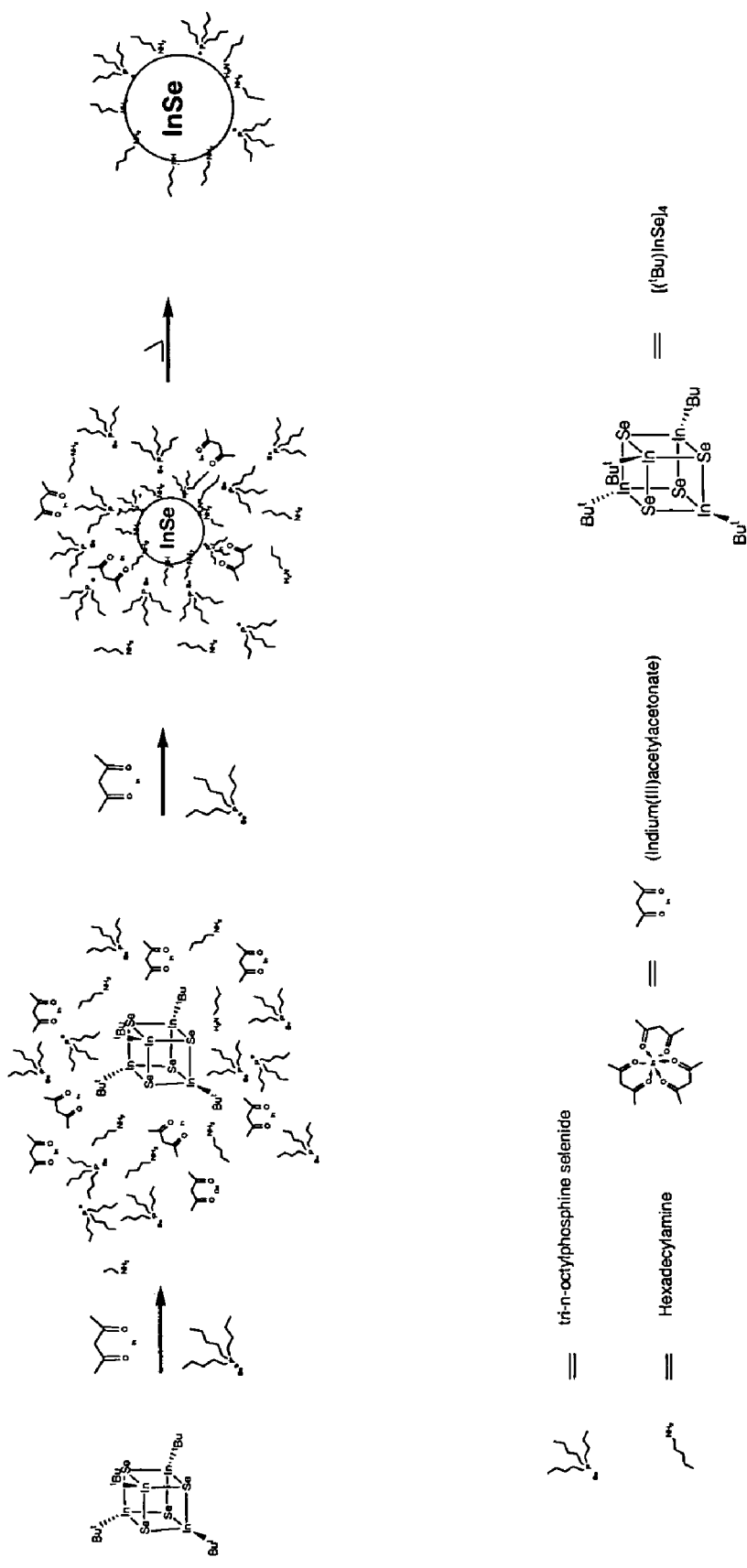
FIG. 5 illustrates the formation of a indium selenide quantum dot using as the molecular seed and Indium(II)acetylacetonate and tri-n-octylphosphine sulfide as the Indium and selenide element-source precursors and with Hexadecylamine and tri-n-octylphosphine oxide used as the capping agent.
Figure 7:
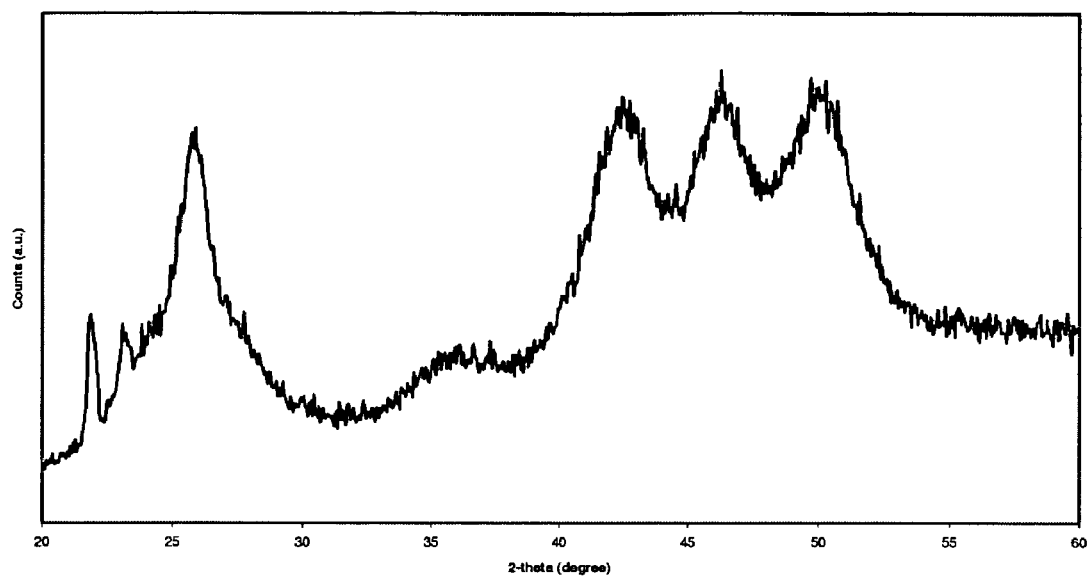
FIG. 7 illustrates a powder x-ray diffraction analysis of CdSe core particles.

Initially some of the molecular cluster, $[HNEt_3]_4[Cd_{10}Se_4(SPh)_{16}]$, and a small quantity of both $Me_2Cd$-TOP and TOPSe (4 mmols) were added to a molten solution of HDA, the temperature was then increased to 110° C. and the reaction stirred for 1 hour which resulted in the on set of CdSe particle formation. Further dropwise addition of both $Me_2Cd$.TOP and TOPSe (4 mmols) lead to a red shift of the PL emission maximum, as monitored by the in situ PL probe. If further precursor was added at this stage there was no further red shift of the PL maximum, thus the particles did not grow anymore. However, when the temperature was increased (20° C.) the PL maximum again red shifted by ca. 10 nm. When more precursor was added to the reaction solution the PL maxima red shifted by 10 nm. Therefore, this cycle of addition of precursor followed by incrementally increasing the reaction temperature was repeated until the PL maxima peak was at ca. 600 nm, at a reaction temperature of 240° C., FIG. 2C. The reaction was then cooled to 80° C. and allowed to anneal for a further 6 hours. After isolation this produced HDA capped CdSe nanoparticles with a PL maximum at 595 nm and a FWHM of 35 nm, which was comparable with particles, produced using the conventional method.

The first step for preparing nanoparticles of a semiconductor material is to use a molecular cluster as a template to seed the growth of nanoparticles from other element source precursors. This is achieved by mixing small quantity of a cluster which is to be used as the template with a high boiling solvent which can also be the capping agent, being a Lewis base coordination compound such as but not restricted to a phosphine, a phosphine oxide or an amine such as TOP, TOPO or HDA; or an inert solvent such as a alkane (octadecence) with the addition of a capping agent compound such as oleic acid. Following initiation of nanoparticle growth, the reaction temperature is increased further portions of source precursors of M and E are periodically added, preferably either dropwise when in liquid from or as quantities of solid powder. The M and E precursor source can either be in the form of two separate precursors one containing M and the other containing E or as a single-source precursor that contains both M and E within a single molecule.

Further to this other regents may or may not be added to the reactions which have the ability to control the shape of the nanoparticles grown. These additives are in the form of a compound that can preferentially bind to a specific face (lattice plane) of the growing nanoparticle and thus inhibit or slow grow along that specific direction of the particle. Other element source precursors may or may not be added to the reaction so as to produce ternary, quaternary or doped particles.

The molecular cluster is mixed with coordinating compound and the reaction mixture is then heated at a steady rate until particle growth is initiated upon the surfaces of the molecular cluster-templates. At an appropriate temperature quantities of M and E precursors may be added to the reaction mixture. Further precursor addition can be in the form of batch addition whereby solid precursor or solutions containing precursor are added over a period of time or by continuous dropwise addition. Because of the complete separation of particle nucleation and growth, the current invention displays a high degree of control in terms of particle size, which is controlled by the temperature of the reaction and concentrations of precursors present. Once the desired particle size is obtained, as established from UV and/or PL spectra of the reaction solution either by an in situ optical probe or from aliquots of the reaction solution, the temperature may or may not be reduced by ca. 30-40° C. and the mixture left to "size-focus" for a period of time being from 10 minutes to 72 hours.

Further consecutive treatment of the as formed nanoparticles to form core-shell or core-multi shell particles may be undertaken. Core-shell particle preparation is undertaken either before or after nanoparticle isolation, whereby the nanoparticles are isolated from the reaction and redissolved in new (clean) capping agent as this results in a better quantum yield. A source for N and a source for Y precursor are added to the reaction mixture and can be either in the form of two separate precursors one containing N and the other containing Y or as a single-source precursor that contains both N and Y within a single molecule to form a core-shell particle of ME/NY core-shell material.

The process may be repeated with the appropriate element precursors until the desired core-multi shell material is formed. The nanoparticles size and size distribution in an ensemble of particles is dependent by the growth time, temperature and concentrations of reactants in solution, with higher temperatures producing larger nanoparticles.

Type of Cluster Used for Seeding

Aspects of the invention include the use of molecular clusters, whereby the clusters used are identical molecular entities as compared to nanoparticles, which inherently lack the anonymous nature of molecular clusters in an assembly. The clusters act as "embryo-type" templates for the growth of nanoparticles whereby other molecular sources precursors contribute ions to the growth process and thus clusters subsequently grow into particles. The molecular clusters to be used may comprise or consist of:

- Both elements required within the as-to-be-grown nanoparticle either with or without other elements present plus organic moieties;
- One element required within the as-to-be-grown nanoparticle either with or without other elements present plus organic moieties;
- Neither element required within the as-to-be-grown nanoparticle either with or without other elements present plus organic moieties;

Preferably, a cluster used is allows initiation of particle growth either via consumption of other clusters or from reaction with the precursors present. Thus, the cluster can be used as a template for particle growth.

Examples of clusters that may be used include, but are not restricted to,

IIB-VIB:—[{(PPh$_3$)Hg}$_4$(SPh)$_6$]: (Ph$_4$P)$_2$[(SEt)$_5$(Br) (HgBr)$_4$]: (Ph$_4$P)$_2$[Hg$_4$(SEt)$_5$Br]: [Hg$_4$Te$_{12}$] [N(CH$_2$CH$_2$Et)$_4$]$_4$

IIB-VIB:—[Et$_3$NH]$_4$[Cd$_{10}$Se$_4$(SPh)$_{16}$] [RME$^r$BU]$_5$ M=Zn, Cd, Hg; E=S, Se, Te; R=Me, Et, Ph: [X]$_4$[E$_4$M$_{10}$(SR)$_{16}$] E=S, Se, Te, M=Zn, Cd, Hg; X=Me$_3$NH$^+$, Li$^+$, Et$_3$NH$^+$: [Cd$_{32}$Se$_{14}$(SPh)$_{36}$]L: [Hg$_{10}$Se$_4$(SePh)(PPh$_2$nPr)$_4$]; [Hg$_{32}$Sel$_4$(SePh)$_{36}$]; [Cd$_{10}$Se$_4$(SePh)$_{12}$(PPr$_3$)$_4$]; [Cd$_{32}$Sel$_4$(SePh)$_{36}$(PPh$_3$)$_4$]; [M$_4$(SPh)$_{12}$]$^{+[X]}$$_2$$^-$ M=Zn, Cd, Hg; X=Me$_4$N$^+$, Li$^+$: [Zn(SEt)Et]$_{10}$: [MeMEiPr] M=Zn, Cd, Hg; E=S, Se, Te: [RCdSR']$_5$ R=O(ClO$_3$), R'=PPh$_3$, $^i$Pr: [Cd$_{10}$E$_4$(E'Ph)$_{12}$(PR$_3$)$_4$] E, E'=Te, Se, S: [Cd$_8$Se(SePh)$_{12}$Cl$_4$]$^{2-}$: [M$_4$Te$_{12}$]$^{4-}$ M=Cd, Hg: [Ph$_{12}$M$_{18}$Cd$_{10}$(PEt$_3$)$_3$] M=Te, Se:

II-V:—[RCdNR']$_4$ R=Cl, Br, I, PEt$_3$, C=CSMe$_3$; R'=PEt$_3$,I: [RCdNR']$_5$ R=alkyl or aryl group and R'=alkyl or aryl group: [{RZn}$_6${PR'}$_4$] R=I, PEt$_2$Ph, R'=SiMe$_3$: [M$_4$Cl$_4$(PPh$_2$)$_4$(PnPr$_3$)$_2$] M=Zn, Cd: [Li(thf)$_4$]$_2$[(Ph$_2$P)$_{10}$Cd$_4$]: [Zn$_4$(PPh$_2$)$_4$Cl$_4$(PRR$_2$')$_2$] PRR'$_2$=PMe''Pr$_2$, P''Bu$_3$, PEt$_2$Ph: [Zn$_4$(P$^t$Bu$_2$)$_4$C$_4$]

III-V [EtGaNEt]$_6$; [MeGaN(4-C$_6$H$_4$F)]$_6$; (MeGaNiBu)$_6$; [RAlNR']$_4$R=Me, CH$_2$Pr$^i$, Ph; R'=Pr$^i$, CH$_2$Pr$^i$, C$_6$H$_2$Me$_3$; [(SiPr$^i$$_3$)$_3$AsAlH]$_6$; [$^i$PrNAlH]$_4$; [RAlNR']$^6$R=Me, Et, Cl, CH$_2$Ph, CH$_2$Pr$^i$, Ph; R'=Me H, Br, C=CPh, Pr$^i$, (CH$_2$)$_2$Me, (CH$_2$)2NMe$_2$, SiPh$_3$: [CH$_3$Ga—NCH$_2$CH(CH$_3$)$_2$]$_6$: [MeGaN$^i$Bu]$_6$: [RGaNR']$_4$ R=Ph, Me; R'=Ph, C$_6$F$_5$, SiMe$_3$, tBu: [EtGa-NEt]$_6$: [RGaPR$^i$]$_4$ R=$^i$Pr, C$_6$H$_2$Me$_3$; R'=tBu: C$_6$H$_2$Me$_3$: [RNInR']$_4$ R=Cl, Br, I, Me; R'=$^t$Bu, C$_6$F$_5$, C$_6$H$_4$F: [RInPR']$_4$ R=$^i$Pr, C$_6$H$_2$Me$_3$, Et; R'=SiPh$_3$, C$_6$H$_2$Me$_3$, Si$^i$Pr$_3$: [RInPR']$_6$ R=Et, R'=SiMe$_2$(CMe$_2$$^i$Pr)

III-VI [($^t$Bu)GaSe]$_4$; [$^t$BuGaS]$_7$; [RInSe]$_4$ R=$^t$Bu, CMe$_2$Et, Si($^t$Bu)$_3$, C((SiMe$_3$)$_3$)$_3$; [RInS]$_4$ R=$^t$Bu, CMe$_2$Et; [RGaS]$_4$ R=$^t$Bu, CMe$_2$Et, CEt$_3$: [SAlR']$_4$ R=C(SMe$_3$)$_3$, CEtMe$_2$: [SAlNMe$_3$]$_5$: [TeAlR]4 R=CP*, CEtMe$_2$: [(C(SiMe$_3$)$_3$)GaS]$_4$: [$^t$BuGaS]$_6$: [RGaSe]$_4$ R=$^t$Bu, CMe$_2$Et, CEt$_3$, C(SiMe$_3$)$_3$, Cp*, Bu: Cd$_4$In$_{16}$S$_{33}$.(H$_2$O)$_{20}$(C$_{10}$H$_{28}$N$_4$)$_{2.5}$:

IV-VI [S$_6${SnR}$_4$] R=C(SiMe$_3$)$_3$, Me, Ph; [Se$_6${SnR}$_4$] R=C$_6$F$_5$, C$_6$H$_2$Me$_3$, p-Tol, C(SiMe$_3$)$_3$

Material consisting of a first element from any group in the transition metals of the periodic table and a second element from any group of the d-block elements include but are not restricted to: [Cu$_{12}$Se$_6$(PR$_3$)$_8$] R=Et$_2$Ph, $^n$Pr$_3$, Cy$_3$; [Cu$_{18}$Te$_6$($^t$Bu)$_6$(PPh$_2$Et)$_7$]; [Cu$_{19}$Te$_6$($^t$Bu)$_7$(PEt$_3$)$_8$]; [Cu$_{27}$Te$_{15}$(P$^i$Pr$_2$Me)$_{12}$]; [Ni$_{34}$Se$_{22}$(PPh$_3$)$_{10}$]; [Ag$_{30}$(TePh)$_{12}$Te$_{15}$(PEt$_3$)$_{12}$]; [Ag$_{30}$Se$_8$(Se$^t$Bu)$_{14}$(PnPr$_3$)$_8$]; [Co4(μ$_3$-Se)$_4$(PPh$_3$)$_4$]; [Co$_6$(μ$_3$-Se)$_8$(PPh$_3$)$_6$]; [W$_3$Se$_4$(dmpe)$_3$Br$_3$]$^+$; Ru$_4$Bi$_2$(CO)$_{12}$; Fe$_4$P$_2$(CO)$_{12}$; Fe$_4$N$_2$(CO)$_{12}$ M Source For a compound semiconductor nanoparticle consisting of elements (ME)$_n$L$_m$ a source for element M is further added to the reaction and can consist of any M-containing spices that has the ability to provide the growing particles with a source of M ions. The precursor can consist of but is not restricted to an organometallic compound, an inorganic salt, a coordination compound or the element.

Examples of II-VI, III-V, III-VI or IV-V for the first element include but are not restricted to:

- Organometallic such as but not restricted to a MR$_2$ where M=Mg R=alky or aryl group (Mg$^t$Bu$_2$); MR$_2$ where M=Zn, Cd, Te; R=alky or aryl group (Me$_2$Zn, Et$_2$Zn Me$_2$Cd, Et$_2$Cd); MR$_3$ Where M=Ga, In, Al, B; R=alky or aryl group [AlR$_3$, GaR$_3$, InR$_3$ (R=Me, Et, $^i$Pr)].
- Coordination compound such as a carbonate but not restricted to MCO$_3$ where M=Ca, Sr, Ba, [magnesium carbonate hydroxide (MgCO$_3$)$_4$Mg(OH)$_2$]; MCO$_3$ where M=Zn, Cd,; MCO$_3$ where M=Pb; acetate; Cd(CH$_3$CO$_2$)$_2$, M(CH$_3$CO$_2$)$_2$ where M=Mg, Ca, Sr, Ba; Zn, Cd, Hg; M(CH$_3$CO$_2$)$_3$ where M=B, Al, Ga, or In, M(CH$_3$C)$_3$ M=B, Al, Ga, In; a β-diketonate or derivative thereof, such as acetylacetonate (2,4-pentanedionate), [CH$_3$COCH=C(O—)CH$_3$]$_2$ where M=Mg, Ca, Sr, Ba, Zn, Cd, or Hg; [CH$_3$COCH=C(O—)CH$_3$]$_3$ where M=B, Al, Ga, In. oxalate SrC$_2$O$_4$, CaC$_2$O$_4$, BaC$_2$O$_4$, SnC$_2$O$_4$, MC$_2$O$_4$ where M=Sr, Ca, Ba or SnC$_2$O$_4$, Cd(OH)$_2$, M(OH)$_2$ where M=Mg, Ca, Sr, Ba, Zn, Hg, and M(Cl$_7$H$_{35}$COO)$_2$ where M=Mg, Ca, Sr, Ba, Zn, Cd, Hg.

Inorganic salt such as but not restricted to a Oxides SrO, ZnO, CdO, $In_2O_3$, $Ga_2O_3$, $SnO_2$, $PbO_2$; Nitrates $Mg(NO_3)_2$, $Ca(NO_3)_2$, $Sr(NO_3)_2$, $Ba(NO_3)_2$, $Cd(NO_3)_2$, $Zn(NO_3)_2$, $Hg(NO_3)_2$, $Al(NO_3)_3$, $In(NO_3)_3$, $Ga(NO_3)_3$, $Sn(NO_3)_4$, $Pb(NO_3)_2$ An element Mg, Ca, Sr, Ba, Zn, Cd, Hg, B, Al, Ga, In, Sn, Pb.

E Source

For a compound semiconductor nanoparticle consisting of elements $(ME)_nL_m$ a source for element E is further added to the reaction and can consist of any E-containing spices that has the ability to provide the growing particles with a source of E ions. The precursor can consist of but are not restricted to an organometallic compound, an inorganic salt, a coordination compound or an elemental source. Examples for an II-VI, III-V, III-VI or IV-V semiconductor were the second element include but are not restricted to:

Organo- or hydrido-compound such as but not restricted to a $NR_3$, $PR_3$, $AsR_3$, $SbR_3$ (R=Me, Et, $^tBu$, $^iBu$, $Pr^i$, Ph etc.); $NHR_2$, $PHR_2$, $AsHR_2$, $SbHR_2$ (R=Me, Et, $^tBu$, $^iBu$, $Pr^i$, Ph etc.); $NH_2R$, $PH_2R$, $AsH_2R$, $SbH_2R_3$ (R=Me, Et, $^tBu$, $^iBu$, $Pr^i$, Ph etc.); $PH_3$, $AsH_3$; $M(NMe)_3$ M=P, Sb, As; dimethyldrazine $(Me_2NNH_2)$; ethylazide (Et-NNN); hydrazine $(H_2NNH_2)$; $Me_3SiN_3$.

$MR_2$ (M=S, Se Te; R=Me, Et, $^tBu$, $^iBu$ etc.); HMR (M=S, Se Te; R=Me, Et, $^tBu$, $^iBu$, $^iPr$, Ph etc); thiourea S=C$(NH_2)_2$; Se=C$(NH_2)_2$.

$Sn(CH_4)_4$, $Sn(C_4H_9)$, $Sn(CH_3)_2(OOCH_3)_2$.

Coordination compound such as but not restricted to a carbonate, $MCO_3$ where M=divalent metal ion, preferably M=P, bismuth subcarbonate $(BiO)_2CO_3$; $M(CO_3)_2$ where M=monovalent metal ion; acetate $M(CH_3CO)_2$ where M=S, Se, Te; $M(CH_3C)_3$ or $M(CH_3CO_2)_2$ or $M(CH_3CO_2)_4$ where M=Sn, Pb: a β-diketonate or derivative thereof, such as acetylacetonate (2,4-pentanedionate)

$[CH_3COCH=C(O—)CH_3]_3M$ where M=Bi; $[CH_3COCH=C(O—)CH_3]_2M$ where M=S, Se, Te; $[CH_3COCH=C(O—)CH_3]_2M$ where M=Sn, Pb: thiourea, selenourea $H_2NC(=Se)NH_2$ Inorganic salt such as but not restricted to Oxides $P_2O_3$, $As_2O_3$, $Sb_2O_3$, $Sb_2O_4$, $Sb_2O_5$, $Bi_2O_3$, $SO_2$, $SeO_2$, $TeO_2$, $Sn_2O$, PbO, $PbO_2$; Nitrates $Bi(NO_3)_3$, $Sn(NO_3)_4$, $Pb(NO_3)_2$ An element:—Sn, Ge, N, P, As, Sb, Bi, S, Se, Te, Sn, Pb.

ME Single Source Precursors

For a compound semiconductor nanoparticle consisting of elements ME a source for M and E elements can also be in the from of a single chemical entity which is a single-source precursor, whereby the precursor to be used contains both M and E within the single molecule. This precursor can be an organometallic compound and inorganic salt or a coordination compound, $(M_aE_b)L_c$ Where M and E are the elements required within the nanoparticles and L is the capping ligands.

Examples for an II-VI semiconductor where M=II and E=VI element can be but is not restricted to bis(dialkyldithiocarbamato)M,(II) complexes or related Se and Te compounds of the formula $M(S_2CNR_2)_2$ M=Zn, Cd, Hg; S=S, Se, O, Te and R=alkyl or ary groups; CdS $Cd[SSiMe_3]_2$, $Cd(SC-NHNH_2)_2Cl_2$, $Cd(SOCR)_2.py$; CdSe $[Cd(SePh)_2]_2$.

For III-V semiconductors the precursors can be but are not restricted to for GaN $[(Me)_2GaN(H)^tBu]_2$ $[H_2GaNH_2]_3$; for GaP $[Ph_2GaP(SiMe_3)_3Ga(Ph)_2Cl][Et_2GaP(SiMe_3)_2]_2$, $[Et_2GaPEt_2]_3$, $[^tBu_2GaPH_2]_3$ $[Me_2GaP(^iPr)_2]_3$ $[^tBuGaPAr']_2$, $[^tBu_2GaP(H)C_5H_9]_2$; for GaAs $Ga(As^tBu_2)_3$ $[Et_2GaAs(SiMe_3)_2]_2$, $[^tBu_2GaAs(SiMe_3)_2]_2$; for GaSb $[Et_2GaSb(SiMe_3)_2]_2$; for InP $[(Me_3SiCH_2)_2InP(SiMe_3)_2]_2$ $[R_2InP(SiMe_3)_2]_2$, $[Me_2InP^tBu_2]_2$; for InSb $[Me_2InSb^tBu_2]_3$ $[Et_2InSb(SiMe_3)_2]_3$, $[Me_2InNEt_2]_2$, $[Et_2AlAs^tBu_2]_2$; for AlSb $[^tBu_2AlSb(SiMe_3)_2]_2$; for GaAs $[^tBu_2GaAs^tBu_2]_2$ $[Me_2Ga_2As^tBu_2]_2$ $[Et_2GaAs^tBu_2]_2$ For II-V semiconductors, the precursors can be but are not restricted to for $Cd_3P_2$ $[MeCdPBu_2]_3$, $Cd[P(SiPh_3)_2]_2$, $Zn_3P_2$ or $Zn[P(SiPh_3)_2]_2$.

For IV-VI semiconductors, the precursors can be but are not restricted to for PbS lead (II) dithiocarbamates; for PbSe Lead (II)selenocarbamates.

EXAMPLES

All syntheses and manipulations were carried out under a dry oxygen-free argon or nitrogen atmosphere using standard Schienk and glove box techniques. All solvents were analytical grade and distilled from appropriate drying agents prior to use (Na/K-benzophenone for THF, $Et_2O$, toluene, hexanes, pentane; magnesium for methanol and ethanol and calcium hydride for acetone). All chemicals were analytical grade; hexadecylamine (HDA), selenium and TOP, were procured commercially (Adrich) and used without further purification. Dimethylcadmium $(Me_2Cd)$ was of ultra high purity and obtained from Epichem as a kind gift.

Elemental analyses were performed on a CARLO ERBA CHNS-O EA1108•Elemental Analyzer. UV-Vis absorption spectra were measured on a Heλiosβ Thermospectronic. Photoluminescence (PL) spectra were measured with a Fluorolog-3 (FL3-22) photospectrometer with an excitation wavelength of 380 nm spectra were obtained with the slits set at 2 nm and an integration time of 1 s or measured in situ using an Ocean Optics 2000 USB probe. Powder X-Ray diffraction (PXRD) measurements were performed on a Bruker AXS D8 diffractometer using monochromatic Cu—$K_α$ radiation with the samples mounted flat and scanned from 10° to 70° with step sizes of 0.04° with a count rate of 2.5 sec. Measurements were taken using a glancing angle incidence detector at an angle of 3° for 2θ values over 20°-60° in steps of 0.04° with a count time of 1 s.

A Philips CM200 transmission electron microscope was used to observe the morphology and size distribution of nanoparticles and for energy dispersive analysis of X-ray fluorescence (EDAX). The samples for TEM and EDAX were prepared by placing a drop of a dilute suspension of sample in toluene on a copper grid (300 meshes, Agar Scientific). The excess solvent was allowed to dry at room temperature.

Cluster Preparation

Preparation of $[HNEt_3]_2[Cd_4(SPh)_{10}]$

To a stirred methanol (60 ml) solution of benzenethiol (20.00 g, 182 mmol) and triethylamine (18.50 g, 182 mmoL) was added dropwise $Cd(NO_3)_2 4H_2O$ (21.00 g, 68.00 mmol) that had previously been dissolved in methanol (60 mL). In an attempt to make the lithium salt, lithium nitrate (18.50 g, 182 mmol) dissolved in 40 ml mL was added. The solution was then allowed to stir while warming until the precipitate had completely dissolved to leave a clear solution. This was then place at 5° C. for 24 h in which time large colourless crystals of $[HNEt_3]_2[Cd_4(SPh)_{10}]$ had formed. FW=1745.85. Anal. Calcu for $C_{72}H_{82}N_2S_{10}Cd_4$ C=49.53, H=4.70, N=1.61, S=18.37, Cd=25.75%. Found C=49.73, H=4.88, N=1.59, S=17.92%.

Preparation of $[HNEt_3]_4[Cd_{10}Se_4(SPh)_{16}]$

To a stirred acetonitrile (100 ml) solution of $[HNEt_3]_2[Cd_4(SPh)_{10}]$ (80.00 g, 45.58 mmol) was added 3.57 g 45.21 mmol of selenium powder, the resulting slurry was left to stirrer for 12 hours, this produced a white precipitate. A further 750 ml of acetonitrile was added and the solution warmed to 75° C. to give a clear pale yellow solution which was allowed to cool to 5° C., yielding large colourless crystals. The crystals were washed in hexane and recrystallized from hot acetonitrile. To give 22.50 g of $[HNEt_3]_4[Cd_{10}Se_4(SPh)_{16}]$. FW=3595.19 Anal. Calc for $C_{120}H_{144}N_4Se_4S_{16}Cd_{10}$. C=40.08, H=4.00, N=1.56, S=14.27, Se=8.78, Cd=31.26%. Found C=40.04, H=4.03, N=1.48, S=14.22, Cd=31.20%.

Nanoparticle Preparation

Preparation from $[HNEt_3]_4[Cd_{10}Se_4(SPh)_{16}]$/TOPSe/$Me_2Cd$.TOP in HDA by Dropwise Addition of $Me_2Cd$.TOP HDA (500 g) was placed in a three-neck round bottomed flask and dried and degassed by heating to 120° C. under a dynamic vacuum for >1 hour. The solution was then cooled to 60° C. To this was added 0.718 g of $[HNEt_3]_4[Cd_{10}Se_4(SPh)_{16}]$ (0.20 mmols). In total 42 mmols, 22.0 ml of TOPSe and 42 mmols, (19.5 ml, 2.15 M) of $Me_2Cd$.TOP was used. Initially 4 mmol of TOPSe and 4 mmols of $Me_2Cd$.TOP were added to the reaction at room temperature and the temperature increased to 110° C. and allowed to stir for 2 hours. The reaction was a deep yellow colour, the temperature was progressively increased at a rate of ~1° C./5 min with equimolar amounts of TOPSe and $Me_2Cd$.TOP being added dropwise. The reaction was stopped when the PL emission maximum had reached ~600 nm, by cooling to 60° C. followed by addition of 300 ml of dry ethanol or acetone. This produced a precipitation of deep red particles, which were further isolated by filtration. The resulting CdSe particles were recrystallized by re-dissolving in toluene followed by filtering through Celite followed by re-precipitation from warm ethanol to remove any excess HDA, selenium or cadmium present. This produced 10.10 g of HDA capped CdSe nanoparticles. Elemental analysis C=20.88, H=3.58, N=1.29, Cd=46.43%. Max PL=585 nm, FWHM=35 nm. 38.98 mmols, 93% of $Me_2Cd$ consumed in forming the quantum dots.

Figure 8:
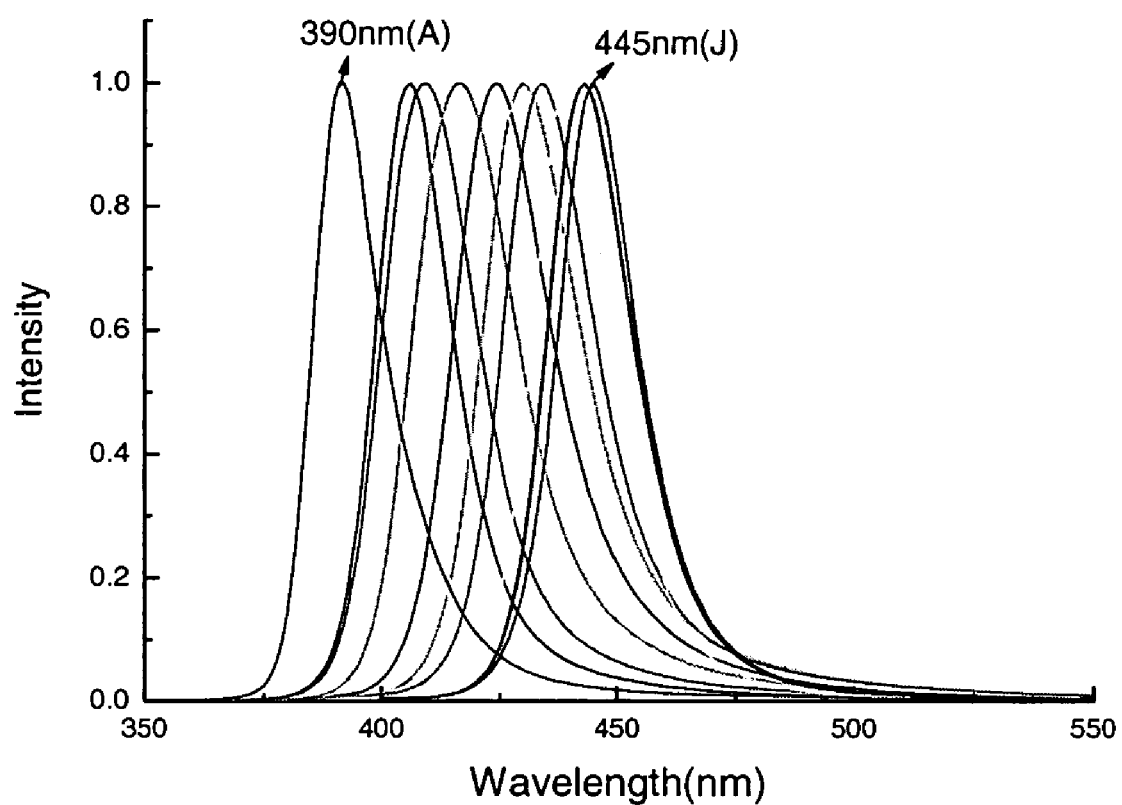
FIG. 8 illustrates the evolution of the PL spectra for the formation of ZnS nanoparticles from $[EtNH]_4[Zn_{10}S_4(SPh)_{16}]$ seeds in HDA by dropwise addition of $Et_2Zn$ and S-octylamine. Note shift of blue emission spectra as more precursors are added and the reaction temperature increased.

Preparation of ZnS Nanoparticles From $[Et_3NH]_4Zn_{10}S_4(SPh)_{16}$ Seeds in HDA by Dropwise Addition of $Et_2Zn$ and S-octylamine A 200 g portion of hexadecylamine (HDA) was placed in a three-neck round-bottomed flask and dried and degassed by heating to 120° C. under a dynamic vacuum for >1 hour. The solution was cooled to 60° C., the reaction flask was filled with nitrogen and the following reagents were loaded into the flask using standard airless techniques: 0.6 g $[HNEt_3]_4[Zn_{10}S_4(SPh)_{16}]$ (0.2 mmol), 4 mL of a 0.5M solution of $Et_2Zn$ in trioctylphosphine (2 mmol), and 4 mL of a 0.5 M solution of elemental sulphur in octylamine (2 mmol). The temperature was increased to 120° C. and allowed to stir for 2 hours. At this point a programmed temperature ramp from 120° C. to 210° C. at a rate of 0.2° C./min was initiated. Simultaneously, 8 mL of 0.5 M $Et_2Zn$ and 8 mL of 0.5 M S-octylamine were added dropwise at a rate of ~0.05 mL/min. The reaction was stopped when the PL emission maximum had reached the required emission ($\lambda_{max}$=391 nm, FWHM=95 nm, see FIG. 8) by cooling to 60° C. followed by addition to 300 ml of dry ethanol or acetone to precipitate the particles from solution. This precipitate was isolated by filtration. The resulting ZnS particles were further purified (to remove excess HDA, sulphur and zinc) by re-dissolving in toluene, filtering the solution through Celite and re-precipitating from warm ethanol (product yield: 0.9 g).

Preparation of Capped Nanoparticles

Preparation of CdSe/ZnS-HDA Capped Nanoparticles

HDA (800 g) was placed in a three neck round-bottom flask, dried and degassed by heating to 120° C. under a dynamic vacuum for >1 hour. The solution was then cooled to 60° C., to this was added 9.23 g of CdSe nanoparticles that have a PL maximum emission of 585 nm. The HDA was then heated to 220° C. To this was added by alternate dropwise addition a total of 20 ml of 0.5M $Me_2Zn$.TOP and 0.5M, 20 ml of sulfur dissolved in octylamine. Three alternate additions of 3.5, 5.5 and 11.0 ml of each were made, whereby initially 3.5 ml of sulphur was added dropwise until the intensity of the PL maximum was near zero. Then 3.5 ml of $Me_2Zn$.TOP was added dropwise until the intensity of the PL maximum had reached a maximum. This cycle was repeated with the PL maximum reaching a higher intensity with each cycle. On the last cycle, additional precursor was added once the PL maximum intensity been reached until it was between 5-10% below the maximum intensity, and the reaction was allowed to anneal at 150° C. for 1 hour. The reaction mixture was then allowed to cool to 60° C. whereupon 300 ml of dry "warm" ethanol was added which resulted in the precipitation of particles. The resulting CdSe—ZnS particles were dried before re-dissolving in toluene and filtering through Celite followed by re-precipitation from warm ethanol to remove any excess HDA. This produced 12.08 g of HDA capped CdSe—ZnS core-shell nanoparticles. Elemental analysis C=20.27, H=3.37, N=1.25, Cd=40.11, Zn=4.43%; Max PL 5.90 nm, FWHM 36 nm.

Preparation of ZnSe/ZnS Nanoparticles 1. 80 g of hexadecylamine and a magnetic spinbar were loaded into a 250 mL round bottom flask.
2. The flask was attached to the schlenk line and heated to 100° C. under vacuum in order to degas the solvent for approximately 1 hr.
3. The solvent temperature was lowered to 70° C. and the flask was filled with nitrogen.
4. 2.5 g of Zinc cluster and 5 mL of a 1.0 M selenium stock solution (selenium powder dissolved in trioctylphosphine) were added to the flask.
5. The reaction solution temperature was raised from 70° C. to 160° C. over a period of 1 to 2 hours during which nanocrystal growth was monitored via absorbance spectroscopy and/or photoluminescence spectroscopy.
6. 2 mL of a 0.5 M diethyl zinc stock solution (diethyl zinc diluted in trioctylphosphine) and 1 ml of the 1.0 M selenium stock solution were added dropwise to the reaction mixture at 160° C.
7. The reaction solution temperature was raised from 160° C. to 250° C. over a period of 2 to 3 hours during which nanocrystal growth was monitored via absorbance spectroscopy and/or photoluminescence spectroscopy.
8. 2 mL of the 0.5 M diethyl zinc stock solution and 1 ml of the 1.0 M selenium stock solution were added dropwise to the reaction mixture at 245° C.
9. The reaction mixture was held at 245° C. for approximately 30 min and nanocrystal growth was monitored.
10. 2 mL of the 0.5 M diethyl zinc stock solution and 1 ml of the 1.0 M selenium stock solution were added dropwise to the reaction mixture at 245° C.
11. The reaction solution temperature was raised from 245° C. to 280° C. over a period of 1 to 2 hours during which nanocrystal growth was monitored via absorbance spectroscopy and/or photoluminescence spectroscopy.
12. 2 mL of the 0.5 M diethyl zinc stock solution and 1 ml of the 1.0 M selenium stock solution were added dropwise to the reaction mixture at 280° C.
13. The reaction mixture was held at 280° C. for approximately 30 min and nanocrystal growth was monitored.
14. 2 mL of the 0.5 M diethyl zinc stock solution and 1 ml of the 1.0 M selenium stock solution were added dropwise to the reaction mixture at 280° C.
15. Upon seeing that no further nanocrystal growth was occurring, the reaction mixture temperature was lowered to 170° C.
16. 4 mL of the 0.5 M diethyl zinc stock solution and 2 mL of a 1.0 M bis-trimethylsilylsulfide stock solution (bis-trimethylsilylsulfide diluted in trioctylphosphine) were added dropwise to the reaction mixture at 170° C.
17. The reaction temperature was lowered to 150° C. and held overnight.
18. 4 mL of the 0.5 M diethyl zinc stock solution and 2 mL of the 1.0 M bis-trimethylsilylsulfide stock solution were added dropwise to the reaction mixture at 140° C.
19. After several hours the reaction temperature was lowered in order to isolate the nanocrystals
20. Nanocrystal isolation was achieved by adding a large excess of methanol in order to precipitate the nanoparticles.
21. This precipitate was isolated via centrifugation and the supernate was discarded.
22. The precipitate was readily dissovled in a variety of organic solvents (chloroform, toluene, hexane, heptane, octane, etc).

Before first Zn(Et)2 and Se addition PL=414 nm

Alternative Preparation of ZnSe/ZnS Nanoparticles
23. 100 g of hexadecylamine and a magnetic spinbar were loaded into a 250 mL round bottom flask.
24. The flask was attached to the schlenk line and heated to 100° C. under vacuum in order to degas the solvent for approximately 1 hr.
25. The solvent temperature was lowered to 70° C. and the flask was filled with nitrogen.
26. 2.5 g of Zinc cluster and 5 mL of a 1.0 M selenium stock solution (selenium powder dissolved in trioctylphosphine) were added to the flask.
27. The reaction solution temperature was raised from 70° C. to 280° C. over a period of 6 to 8 hours during which nanocrystal growth was monitored via absorbance spectroscopy and/or photoluminescence spectroscopy.
28. 2 mL of a 0.5 M diethyl zinc stock solution (diethyl zinc diluted in trioctylphosphine) and 1 ml of the 1.0 M selenium stock solution were added dropwise to the reaction mixture at 280° C.
29. The reaction mixture was held at 280° C. for approximately 30 min and nanocrystal growth was monitored.
30. 6 mL of the 0.5 M diethyl zinc stock solution and 3 ml of the 1.0 M selenium stock solution were added dropwise to the reaction mixture at 280° C.
31. The reaction mixture was held at 280° C. for approximately 30 min and nanocrystal growth was monitored.
32. Upon seeing that no further nanocrystal growth was occurring, the reaction mixture temperature was lowered to 150° C.
33. 4 mL of the 0.5 M diethyl zinc stock solution and 2 mL of a 1.0 M bis-trimethylsilylsulfide stock solution (bis-trimethylsilylsulfide diluted in trioctylphosphine) were added dropwise to the reaction mixture at 150° C.
34. The reaction temperature was lowered to 140° C. and held overnight.
35. The reaction temperature was raised to 150° C. and 4 mL of the 0.5 M diethyl zinc stock solution and 2 mL of the 1.0 M bis-trimethylsilylsulfide stock solution were added dropwise to the reaction mixture.
36. After several hours the reaction temperature was lowered in order to isolate the nanocrystals
37. Nanocrystal isolation was achieved by adding a large excess of methanol in order to precipitate the nanoparticles.
38. This precipitate was isolated via centrifugation and the supernate was discarded.
39. The precipitate was readily dissovled in a variety of organic solvents (chloroform, toluene, hexane, heptane, octane, etc).

The core/shell ZnSe/ZnS nanocrystals obtained via this synthetic route had a PL maximum of 414 nm.

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A method of producing nanoparticles comprising:
effecting conversion of a nanoparticle precursor composition to a material of the nanoparticles, the precursor composition comprising a first precursor species containing a first ion to be incorporated into the nanoparticles and a second precursor species containing a second ion to be incorporated into the nanoparticles, the conversion being effected in the presence of a molecular cluster compound different from the first precursor species and the second precursor species under conditions permitting seeding and growth of the nanoparticles, by
dispersing the molecular cluster compound and an initial portion of the nanoparticle precursor composition which is less than the total amount of the nanoparticle precursor composition to be used to produce the nanoparticles in a suitable dispersing medium at a first temperature;
thereafter, increasing a temperature of the dispersing medium containing the cluster compound and precursor composition to a second temperature sufficient to initiate seeding and growth of the nanoparticles on the molecular clusters of the molecular cluster compound; and
adding at least one further portion of the nanoparticle precursor composition to the dispersing medium containing the nanoparticles.

2. A method in accordance with claim 1, wherein the temperature of the dispersing medium containing the nanoparticles is increased to the second temperature at a rate selected from a range of 0.05° C./min to 1° C./min.

3. A method in accordance with claim 1, wherein a ratio of the number of moles of cluster compound compared to the total number of moles of the first and second precursor species is selected from a range 0.0001-0.1:1.

4. A method in accordance with claim 1, wherein a molar ratio of the first precursor species to the second precursor species is selected from a range of 100-1:1.

5. A method in accordance with claim 1, wherein said first temperature is selected from a range of 15° C. to 60° C.

6. A method in accordance with claim 1, wherein said second temperature is selected from a range 90° C. to 150° C.

7. A method in accordance with claim 1, wherein the at least one further portion of the nanoparticle precursor composition is added dropwise to the dispersing medium containing the nanoparticles.

8. A method in accordance with claim 1, wherein the at least one further portion of the nanoparticle precursor composition is added to the dispersing medium containing the nanoparticles at a rate selected from a range of 0.1 ml/min to 20 ml/min per liter of dispersing medium.

9. A method in accordance with claim 1, wherein said initial portion of the nanoparticle precursor composition is less than or equal to approximately 90% of the total amount of the nanoparticle precursor composition to be used to produce said nanoparticles.

10. A method in accordance with claim 1, wherein said initial portion of the nanoparticle precursor composition is less than or equal to approximately 10% of the total amount of the nanoparticle precursor composition to be used to produce said nanoparticles.

11. A method in accordance with claim 1, wherein a second portion of the nanoparticle precursor composition is added to the dispersing medium containing the nanoparticles and said second portion is less than or equal to approximately 90% of the total amount of the nanoparticle precursor composition to be used to produce said nanoparticles.

12. A method in accordance with claim 1, wherein more than one portion of the nanoparticle precursor composition is added to the dispersing medium containing the nanoparticles and each further portion of the nanoparticle precursor composition is less than or equal to approximately 45% of the total amount of the nanoparticle precursor composition to be used to produce said nanoparticles.

13. A method in accordance with claim 1, wherein more than one portion of the nanoparticle precursor composition is added to the dispersing medium containing the nanoparticles and each further portion is less than or equal to approximately 10% of the total amount of the nanoparticle precursor composition to be used to produce said nanoparticles.

14. A method in accordance with claim 1, wherein formation of said molecular cluster compound is effected in situ in said dispersing medium prior to dispersing the molecular cluster compound and the initial portion of the nanoparticle precursor composition in said dispersing medium.

15. A method in accordance with claim 1, wherein said dispersing medium is a Lewis base coordination compound selected from the group consisting of a phosphine, a phosphine oxide and an amine.

16. A method in accordance with claim 1, wherein the method comprises monitoring the average size of the nanoparticles being grown; and terminating nanoparticle growth when the average nanoparticle size reaches a predetermined value.

17. A method in accordance with claim 16, wherein nanoparticle growth is terminated by reducing the temperature of the solution from the second temperature to a third temperature.

18. A method in accordance with claim 1, wherein the molecular cluster compound comprises third and fourth ions to be incorporated into the nanoparticles.

19. A method in accordance with claim 18, wherein the third ion is selected from group 12 of the periodic table and the fourth ion is selected from group 16 of the periodic table.

20. A method in accordance with claim 19, wherein the molecular cluster compound comprises molecules selected from the group consisting of $[\{(PPh_3)Hg\}_4(SPh)_6]$, $(Ph_4P)_2$ $[(SEt)_5(Br)(HgBr)_4]$, $(Ph_4P)_2$ $[Hg_4(SEt)_5Br]$, $[Hg_4Te_{12}]$ $[N(CH_2CH_2Et)_4]_4$, $[Et_3NH]_4[Cd_{10}Se_4(SPh)_{16}]$, $[RME^iBu]_5$ where M=Zn, Cd or Hg, E=S, Se or Te, and R=Me or Et, $[X]_4[E_4M_{10}(SR)_{16}]$ where M=Zn, Cd or Hg, E=S, Se or Te, X=Me$_3$NH$^+$, Li$^+$ or Et$_3$NH$^+$, and R=Me, Et or Ph, $[Cd_{32}S_{14}(SPh)_{36}]$.L where L=is a coordinating ligand, $[Hg_{10}Se_4(SePh)(PPh_2{}^nPr)_4]$, $[Hg_{32}Se_{14}(SePh)_{36}]$, $[Cd_{10}Se_4(SePh)_{12}(PPr_3)_4]$, $[Cd_{32}Se_{14}(SePh)_{36}(PPh_3)_4]$, $[M_4(SPh)_{12}]+[X]_2^-$ where M=Zn, Cd or Hg, and X=Me$_4$N$^+$, Li$^+$, $[Zn(SEt)Et]_{10}$, $[MeME^iPr]$ where M=Zn, Cd or Hg, and E=S, Se or Te, $[RCdSR']_5$ where R=O(ClO$_3$), R'=PPh$_3$ or $^i$Pr, $[Cd_{10}E_4(E'Ph)_{12}(PR3)_4]$ where E=Te, Se or S, E'=Te, Se or S, and R=is a coordinating ligand, $[Cd_8Se(SePh)_{12}Cl_4]^{2-}$, $[M_4Te_{12}]^{4-}$ where M=Cd or Hg, and $[Ph_{12}M_{18}Cd_{10}(PEt_3)_3]$ where M=Te or Se.

21. A method in accordance with claim 18, wherein the third ion is selected from group 12 of the periodic table and the fourth ion is selected from group 15 of the periodic table.

22. A method in accordance with claim 21, wherein the molecular cluster compound comprises molecules selected from the group consisting of $[RCdNR']_4$ where R=Cl, Br, I, PEt$_3$ or C≡CSMe$_3$, and R'=PEt$_3$ or I, $[RCdNR']_5$ where R=alkyl or aryl group, and R'=alkyl or aryl group, $[\{RZn\}_6\{PR'\}_4]$ where R=I or PEt$_2$Ph, and R'=SiMe$_3$, $[M_4Cl_4(PPh_2)_4(P^nPr_3)_2]$ where M=Zn or Cd, $[Li(thf)_4]_2$ $[(Ph_2P)_{10}Cd_4]$, $[Zn_4(PPh_2)_4Cl_4(PRR_2')_2]$ where PRR$'_2$=PMe$^n$Pr$_2$, P$^n$Bu$_3$ or PEt$_2$Ph, and $[Zn_4(P^iBu_2)_4Cl_4]$.

23. A method in accordance with claim 18, wherein the third ion is selected from group 13 of the periodic table and the fourth ion is selected from group 15 of the periodic table.

24. A method in accordance with claim 23, wherein the molecular cluster compound comprises molecules selected from the group consisting of $[EtGaNEt]_6$, $[MeGaN(4-C_6H_4F)]_6$, $(MeGaNiBu)_6$, $[RAlNR']_4$ where R=Me, CH$_2$Pr$^i$ or Ph, and R'=Pr', CH$_2$Pr', C$_6$H$_2$Me$_3$, $[(SiPr^i{}_3)_3AsAlH]_6$, $[^iP$-rNAlH]$_4$, $[RAlNR']_6$ where R=Me, Et, Cl, CH$_2$Ph, CH$_2$Pr' or Ph, and R'=Me, H, Br, C≡CPh, Pr$^i$, (CH$_2$)$_2$Me, (CH$_2$)$_2$NMe$_2$ or SiPh$_3$, $[CH_3Ga—NCH_2CH(CH_3)_2]_6$, $[MeGaN^iBu]_6$, $[RGaNR']_4$ where R=Ph or Me, and R'=Ph, C$_6$F$_5$, SiMe$_3$ or $^t$Bu, $[EtGaNEt]_6$, $[RGaPR']_4$ where R=$^i$Pr or C$_6$H$_2$Me$_3$, and R'=$^t$Bu or C$_6$H$_2$Me$_3$, $[RNInR']_4$ where R=Cl, Br, I or Me, and R'=$^t$Bu, C$_6$F$_5$ or C$_6$H$_4$F, $[RInPR']_4$ where R=$^t$Pr, C$_6$H$_2$Me$_3$ or Et, and R'=SiPh$_3$, C$_6$H$_2$Me$_3$, Si$^i$Pr$_3$, and $[RInPR']_6$ where R=Et, and R'=SiMe$_2$(CMe$_2{}^i$Pr).

25. A method in accordance with claim 18, wherein the third ion is selected from group 13 of the periodic table and the fourth ion is selected from group 16 of the periodic table.

26. A method in accordance with claim 25, wherein the molecular cluster compound comprises molecules selected from the group consisting of $[(^tBu)GaSe]_4$, $[^tBuGaS]_7$, $[RInSe]_4$ where R=$^t$Bu, CMe$_2$Et, Si($^t$Bu)$_3$ or C((SiMe$_3$)$_3$)$_3$, $[RInS]_4$ where R=$^t$Bu or CMe$_2$Et, $[RGaS]_4$ where R=$^t$Bu, CMe$_2$Et or CEt$_3$, $[SAlR]_4$ where R=C(SMe$_3$)$_3$ or CEtMe$_2$, $[SAlNMe_3]_5$, $[TeAlR]_4$ where R=Cp* or CEtMe$_2$, $[(C(SiMe_3)_3)GaS]_4$, $[^tBuGaS]_6$, $[RGaSe]_4$ where R=$^t$Bu, CMe$_2$Et, CEt$_3$, C(SiMe$_3$)$_3$, Cp* or Bu, Cd$_4$In$_{16}$S$_{33}$.(H$_2$O)$_{20}$ (C$_{10}$H$_{28}$N$_4$)$_{2.5}$.

27. A method in accordance with claim 18, wherein the third ion is selected from group 14 of the periodic table and the fourth ion is selected from group 16 of the periodic table.

28. A method in accordance with claim 27, wherein the molecular cluster compound comprises molecules selected from the group consisting of $[S_6\{SnR\}_4]$ where R=C(SiMe$_3$)$_3$, Me or Ph, $[Se_6\{SnR\}_4]$ where R=C$_6$F$_5$, C$_6$H$_2$Me$_3$, p-Tol or C(SiMe$_3$)$_3$.

29. A method in accordance with claim 18, wherein the third ion is selected from the transition metal group of the periodic table and the fourth ion is selected the d-block of the periodic table.

30. A method in accordance with claim 29, wherein the molecular cluster compound comprises molecules selected from the group consisting of $[Cu_{12}Se_6(PR)_8]$ where R=Et$_2$Ph, $^nPr_3$ or Cy$_3$, $[Cu_{18}Te_6(^tBu)_6(PPh_2Et_7)]$, $[Cu_{19}Te_6(^tBu)_7(PEt_3)_8]$, $[Cu_{27}Te_{15}(P^iPr_2Me)_{12}]$, $[Ni_{34}Se_{22}(PPh_3)_{10}]$, $[Ag_{30}(TePh)_{12}Te_9(PEt_3)_{12}]$, $[Ag_{30}Se_8(Se^tBu)_{14}(P''Pr_3)_8]$, $[Co4(\mu_3\text{-}Se)_4(PPh_3)_4]$, $[CO_6(\mu_3\text{-}Se)_8(PPh_3)_6]$, $[W_3Se_4(dmpe)_3Br_3]^+$, $Ru_4Bi_2(CO)_{12}$, $Fe_4P_2(CO)_{12}$, and $Fe_4N_2(CO)_{12}$.

31. A method in accordance with claim 1, wherein said first ion is selected from the group consisting of group 2 of the periodic table, group 12 of the periodic table, group 13 of the periodic table and group 14 of the periodic table.

32. A method in accordance with claim 1, wherein said second ion is selected from the group consisting of group 14 of the periodic table, group 15 of the periodic table and group 16 of the periodic table.

33. A method in accordance with claim 1, wherein the second precursor species is separate to the first precursor species in the nanoparticle precursor composition.

34. A method in accordance with claim 33, wherein said first precursor species is selected from the group consisting of an organometallic compound, an inorganic salt, and a coordination compound.

35. A method in accordance with claim 33, wherein the first precursor species is obtained by dissolving an elemental source selected from the group consisting of Mg, Ca, Sr, Ba, Zn, Cd, Hg, B, Al, Ga, In, Sn, and Pb in a suitable solvent.

36. A method in accordance with claim 33, wherein the second precursor species is selected from the group consisting of an organo compound, a hydrido compound, an inorganic salt, and a coordination compound.

37. A method in accordance with claim 1, wherein the first and second precursor species are part of a single chemical entity in the nanoparticle precursor composition.

38. A method in accordance with claim 37, wherein said single chemical entity is selected from the group consisting of an organometallic compound, an inorganic salt and a coordination compound.

39. A method in accordance with claim 37, wherein said single chemical entity incorporates ions selected from the group consisting of group 12 and group 16 of the periodic table, or group 13 and group 15 of the periodic table, group 12 and group 15 of the periodic table, and group 14 and group 16 of the periodic table.

40. A method in accordance with claim 1, wherein the nanoparticles have cores comprising a core compound comprising fifth and sixth ions.

41. A method in accordance with claim 40, wherein the fifth ion is selected from group 2 of the periodic table and the sixth ion is selected from group 16 of the periodic table, or wherein the fifth ion is selected from group 12 of the periodic table and the sixth ion is selected from group 16 of the periodic table, or wherein the fifth ion is selected from group 12 of the periodic table and the sixth ion is selected from group 15 of the periodic table, or wherein the fifth ion is selected from group 13 of the periodic table and the sixth ion is selected from group 15 of the periodic table, or wherein the fifth ion is selected from group 13 of the periodic table and the sixth ion is selected from group 14 of the periodic table, or wherein the firth ion is selected from group 13 of the periodic table and the sixth ion is selected from group 16 of the periodic table, or wherein the fifth ion is selected from group 14 of the periodic table and the sixth ion is selected from group 16 of the periodic table, or wherein the fifth ion is selected from the transition metal group of the periodic table and the sixth ion is selected from the d-block of the periodic table.

42. A method in accordance with claim 40, wherein the nanoparticle cores comprise a dopant selected from the group consisting of a main group element, and a rare earth element.

43. A method in accordance with claim 40, wherein each nanoparticle comprises at least one shell grown onto the nanoparticle core.

44. A method in accordance with claim 43, wherein the at least one shell has a similar lattice type to the nanoparticle core.

45. A method in accordance with claim 43, wherein the at least one shell has a wider band-gap than the nanoparticle core.

46. A method in accordance with claim 43, wherein the at least one shell comprises a shell compound comprised of seventh and eighth ions.

47. A method in accordance with claim 46, wherein the seventh ion is selected from group 2 of the periodic table and the eighth ion is selected from group 16 of the periodic table, or wherein the seventh ion is selected from group 12 of the periodic table and the eighth ion is selected from group 16 of the periodic table, or wherein the seventh ion is selected from group 12 of the periodic table and the eighth ion is selected from group 15 of the periodic table, or wherein the seventh ion is selected from group 13 of the periodic table and the eighth ion is selected from group 15 of the periodic table, or wherein the seventh ion is selected from group 13 of the periodic table and the eighth ion is selected from group 14 of the periodic table, or wherein the seventh ion is selected from group 13 of the periodic table and the eighth ion is selected from group 16 of the periodic table, or wherein the seventh ion is selected from group 14 of the periodic table and the eighth ion is selected from group 16 of the periodic table, or wherein the seventh ion is selected from the transition metal group of the periodic table and the eighth ion is selected from the d-block of the periodic table.

48. A method in accordance with claim 1, wherein the at least one further portion of the nanoparticle precursor composition is added to the dispersing medium containing the nanoparticles after the temperature of the dispersing medium is increased to the second temperature.

49. A method in accordance with claim 1, wherein, after increasing the temperature of the dispersing medium to the second temperature, the temperature of the dispersing medium containing the nanoparticles is further increased above the second temperature at least before, during, or after the addition of the at least one further portion of the nanoparticle precursor composition.

50. A method of producing nanoparticles comprising:
effecting conversion of a nanoparticle precursor composition to a material of the nanoparticles, said precursor composition comprising a first precursor species containing a first ion to be incorporated into the nanoparticles and a separate second precursor species containing a second ion to be incorporated into the nanoparticles, said conversion being effected in the presence of a molecular cluster compound different from the first precursor species and the second precursor species under conditions permitting seeding and growth of the nanoparticles, wherein the method comprises:
dispersing the molecular cluster compound and an initial portion of one of the first and second precursor species which is less than the total amount of said one of the first and second precursor species to be used to produce said nanoparticles in a suitable dispersing medium at a first temperature;

thereafter, increasing the temperature of the dispersing medium containing the cluster compound and said one of the first and second precursor species to a second temperature which is sufficient to initiate seeding and growth of the nanoparticles on the molecular clusters of said molecular cluster compound; and adding at least one further portion of said one of the first and second precursor species to the dispersing medium containing the nanoparticles.

51. A method in accordance with claim 50, wherein the method further comprises adding to the dispersing medium, when the dispersing medium is at said second temperature, an initial portion of the other of the first and second precursor species which is less than the total amount of said other of said first and second precursor species to be used to produce said nanoparticles.

52. A method in accordance with claim 51, wherein at least one further portion of said other of said first and second precursor species is added to the dispersing medium containing the nanoparticles.

53. A method in accordance with claim 52, wherein the temperature of the dispersing medium containing the nanoparticles is increased at least before, during, or after the addition of the at least one further portion of said other of the first and second precursor species.

54. A method in accordance with claim 52, wherein a temperature of the dispersing medium containing the nanoparticles is maintained at approximately said second temperature during the addition of the at least one further portion of said other of the first and second precursor species.

55. A method in accordance with claim 50, wherein nanoparticle growth is terminated by reducing the temperature of the solution from the second temperature to a third temperature.

56. A method in accordance with claim 50, wherein the temperature of the dispersing medium containing the nanoparticles is increased from the first temperature to the second temperature at a rate selected from a range of 0.05° C./min to 2° C./min.

57. A method in accordance with claim 50, wherein the temperature of the dispersing medium containing the nanoparticles is increased from the first temperature to the second temperature at a rate selected from a range of 0.5° C./min to 1.5° C./min.

58. A method in accordance with claim 50, wherein said first temperature is selected from a range of 15° C. to 80° C.

59. A method in accordance with claim 50, wherein said second temperature is selected from a range of 140° C. to 300° C.

60. A method in accordance with claim 50, wherein the at least one further portion of one of the first and second precursor species is added dropwise to the dispersing medium containing the nanoparticles.

61. A method in accordance with claim 50, wherein the at least one further portion of said one of the first and second precursor species is added to the dispersing medium containing the nanoparticles after the temperature of the dispersing medium is increased to the second temperature.

62. A method in accordance with claim 50, wherein, after increasing the temperature of the dispersing medium to the second temperature, the temperature of the dispersing medium containing the nanoparticles is further increased above the second temperature at least before, during, or after the addition of the at least one further portion of said one of the first and second precursor species.

* * * * *